United States Patent
Song et al.

(10) Patent No.: US 12,317,609 B2
(45) Date of Patent: May 27, 2025

(54) METHOD OF FORMING A DEVICE STRUCTURE

(71) Applicant: LONGi Green Energy Technology Co., Ltd., Xi'An (CN)

(72) Inventors: Ning Song, Sydney (AU); Yang Li, Sydney (AU); Alison Joan Lennon, Sydney (AU); Pei-Chieh Hsiao, Sydney (AU); Zi Ouyang, Sydney (AU); Charles Aram Mandela Hall, Sydney (AU); Carolin Roemer, Sydney (AU); Zhimeng Wang, Sydney (AU)

(73) Assignee: LONGi Green Energy Technology Co., Ltd., Xi'An (CN)

( * ) Notice: Subject to any disclaimer, the term of this patent is extended or adjusted under 35 U.S.C. 154(b) by 637 days.

(21) Appl. No.: 17/594,867

(22) PCT Filed: May 1, 2020

(86) PCT No.: PCT/AU2020/050438
§ 371 (c)(1),
(2) Date: Nov. 1, 2021

(87) PCT Pub. No.: WO2020/220094
PCT Pub. Date: Nov. 5, 2020

(65) Prior Publication Data
US 2022/0293809 A1    Sep. 15, 2022

(30) Foreign Application Priority Data
May 2, 2019   (AU) ................................ 2019901501

(51) Int. Cl.
*H01S 4/00*       (2006.01)
*H10F 19/80*    (2025.01)
(Continued)

(52) U.S. Cl.
CPC ............ *H10F 19/906* (2025.01); *H10F 19/80* (2025.01); *H10F 19/904* (2025.01); *H10F 77/935* (2025.01)

(58) Field of Classification Search
CPC ............. H01L 31/02008; H01L 31/048; H01L 31/0481; H01L 31/0508; H01L 31/0512; H01L 31/0547
See application file for complete search history.

(56) References Cited

U.S. PATENT DOCUMENTS 8,497,153 B2 * 7/2013 Lantzer ............... H01L 31/0516
                                                                           438/66
2013/0312809 A1   11/2013 Luch et al.
(Continued)

FOREIGN PATENT DOCUMENTS

| CN | 104 952 959 | 9/2015 |
| WO | WO 2013/066813 A1 | 5/2013 |
| WO | WO 2013/066815 A1 | 5/2013 |

OTHER PUBLICATIONS

Extended European Search Report in corresponding European Application No. 20798505.2 dated Nov. 30, 2022 in 8 pages.
(Continued)

*Primary Examiner* — Paul D Kim
(74) *Attorney, Agent, or Firm* — IPro, PLLC

(57) ABSTRACT

This relates to a method of forming a device structure, including: providing at least one device component having front and rear device component surfaces and at least one electrically conductive region on the device component surfaces; providing at least one contact sheet including a polymeric material and at least one electrically conductive element with a non-circular cross-sectional shape and embedded in the polymeric material such that a surface portion of the electrically conductive element is exposed; applying a bonding material to one or both of the exposed
(Continued)

surface portion and the electrically conductive regions on the device component surfaces; positioning the contact sheet relative to the device component such that the bonding material is located between the electrically conductive region and the exposed surface portion; activating the bonding material such that a bond and an electrically conductive coupling are formed between the electrically conductive region and the exposed surface portion.

15 Claims, 20 Drawing Sheets

(51) Int. Cl.
*H10F 19/90* (2025.01)
*H10F 77/00* (2025.01)

(56) References Cited

U.S. PATENT DOCUMENTS

2017/0365727 A1* 12/2017 Ishiguro .............. H01L 31/0547
2020/0243695 A1* 7/2020 Henning ............. H01L 31/0512

OTHER PUBLICATIONS

International Search Report received in PCT Application No. PCT/AU2020/050438, dated Jun. 20, 2020 in 7 pages.

Written Opinion of the International Search Report received in PCT Application No. PCT/AU2020/050438, dated Jun. 20, 2020 in 7 pages.

* cited by examiner

910 — Providing at least one device component having a front surface and a rear surface, each of the front surface and the rear surface comprising at least one electrically conductive region 930 — Providing at least one contact sheet comprising a polymeric material and at least one structured electrically conductive element that is embedded in the polymeric material in a manner such that a surface portion of the at least one electrically conductive element is exposed 950 — Applying a bonding material onto at least one of the exposed surface portion and at least one of the electrically conductive regions of the front and rear surfaces 970 — Positioning the at least one contact sheet relative to the at least one device component such that the bonding material is located between the at least one electrically conductive region and the exposed surface portion 990 — Activating the bonding material such that a bond is formed between the at least one electrically conductive region and the exposed surface portion

Figure 9

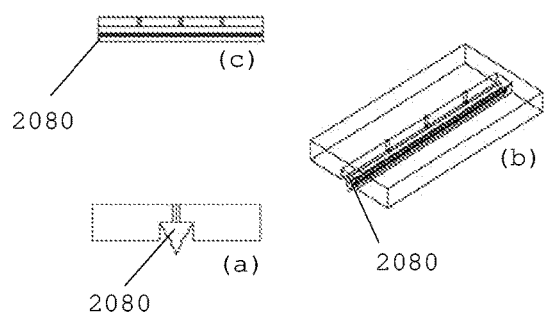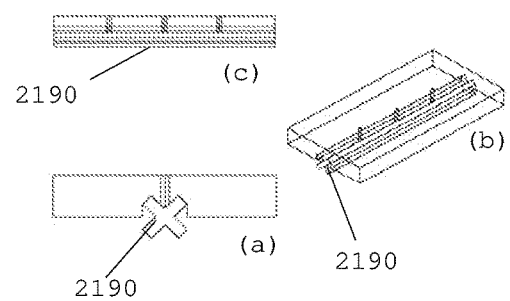
Figure 20                    Figure 21

METHOD OF FORMING A DEVICE STRUCTURE

TECHNICAL FIELD OF THE INVENTION

The present invention relates to a method of forming a device structure.

BACKGROUND OF THE INVENTION

Most solar modules that are used to convert sunlight into electricity comprise arrays of silicon-based solar cells. The individual solar cells are typically fabricated using doped crystalline silicon wafers and include electron-collecting and hole collecting regions. These carrier-collecting regions can be formed by solid state diffusion or by the application of surface layers that can selectively collect one carrier polarity when the solar cell is illuminated. In order to extract the photo-generated electrical carriers from the solar cell, conductive regions comprising metal electrodes (or contacts) are typically formed in contact with the electron and hole-contacting regions of the cell. Conducting wires can then be bonded or connected to these metal electrodes enabling the individual solar cells to be connected into arrays of solar cells configured either in a series or parallel electrical arrangement. The thus-laid out and interconnected cells can then be laminated with encapsulant into a solar module that can be installed in the field to generate electricity through the absorption of solar energy.

The solar cells of most silicon-based solar modules are interconnected by soldering tabbing wire to metal busbar regions formed on each of the solar cells in a solar module. These busbar regions are typically in contact with arrays of thinner metal tracks, or fingers, which are oriented perpendicular to the busbars and act to extract the photo-generated current from the underlying silicon. The electrode grid comprising conductive fingers and busbars comprises the cell-level metallization and is typically formed by screen-printing a metal paste containing silver or aluminium on the solar cells. The grid electrode can also be formed by plating metal such as nickel, copper (Cu) and/or silver (Ag), which can result in reduced metal material costs and very narrow metal fingers, however is less commonly used due to being a less established process.

The soldering process requires localized heating and pressure, which can result in microcracks in the silicon wafers and is of particular concern when thin silicon wafers (e.g., <160 µm) are used in order to reduce the silicon material cost. Another undesirable aspect of this interconnection process is that typically the conductive tabbing wire used to interconnect adjacent cells in a module is coated in a lead (Pb)-based alloy to ensure a low melting point and reduce the temperature at which the soldering can be performed. It is undesirable to use lead in manufactured products due to its deleterious effect on humans and other species. Lead-free solders can alternatively be used; however, these alloys typically require soldering at higher temperatures which is also undesirable.

Although soldering busbar interconnections have been an industrially-accepted way of interconnecting solar cells for many years, the increased photo-generated current achieved in more recently manufactured cells due to their larger areas and improved energy conversion efficiencies has made it more challenging to reduce power losses due to series resistance.

This problem can be addressed by increasing the number of busbars on the cell. Through this adaptation, power losses due to series resistance can be reduced as the magnitudes of the current flowing in both the fingers and busbars is reduced from that in solar cells with only two or three busbars. Furthermore, cell metallization costs can be reduced as fingers can be thinner and therefore less Ag is required. However, these performance and cost advantages are offset by increased complexity of the automated tabbing processes due to the stricter requirements for alignment of thinner busbars. Furthermore, adhesion of the busbars can be impacted by the reduced cell contact area for each individual busbar.

To address these challenges a number of alternative interconnection methods have been developed which do not require busbar contact regions to be formed on the solar cell surfaces. In one alternative approach, an array of Cu wires, coated in a low melting point alloy, are aligned in an array and adhered to an adhesive polymer. This wire-containing polymer sheet can then be placed over the metallized cells, with bonding occurring between the metal fingers of the solar cell and the alloy-coated wires during the lamination process.

An alternative wire-based interconnection process is the MultiBB. The MultiBB process does not require the Cu wires to be held in an adhesive polymer. Instead tabbing equipment is provided that positions the wires over arrays of metallized cells and the bonds between the wires and the cells are achieved by infrared soldering. Other variations on these wire-based interconnection schemes have been reported. For example, in GTAT's Merlin technology, a free-form metal wire network is placed over the cell surface with bonding occurring during the lamination process. Meyer et al. reported a multiwire stringing approach which uses a perpendicularly-arranged wire network running between an upper and lower spooled wire array. In the latter case bonding is achieved using soldering and mechanical actuators are employed to cut the wires to prevent electrical shorting (L. Meyer et al., Manufacturable Multiwire Stringing and Cell Interconnection for silicon Cells and Modules, IEEE Photovoltaics Specialist Conference 2017, Washington, DC).

In all these alternative wire-based interconnection processes, the need to form busbar contact regions on the cells is eliminated. This is beneficial for solar cell device performance as the rate of electrical carrier recombination at metal contact regions is much higher than at surfaces coated with a dielectric material. Furthermore, by being able to position the wires more closely than is possible with existing tabbing wire (which ranges from 0.8 to 1.5 mm in width), the length of the fingers (i.e., distance between busbars) can be substantially reduced. This feature of wire-based interconnection is advantageous for both screen-printed and Cu-plated metallization. For screen-printed cell metallization, it can reduce the required thickness of the paste thereby reducing the amount and hence cost of Ag required. For plated cell metallization, less metal needs to be plated which can improve the adhesion of the metal and reduce the plating time. Furthermore, the use of circular wires in place of flat tabs of interconnection wire can result in increased trapping of light in the underlying cells of a module as rays impinging on the curved surface are reflected back to the front glass at a more oblique angle resulting in a higher probability of the rays being totally internally reflected back into the cell thereby increasing the probability of being absorbed in the solar cell resulting in increased photocurrent.

However, these alternative processes can also present some disadvantages. Typically, they result in an increased interconnection cost to silicon solar module producers compared to the more traditionally-used soldering of tabbing wire. These costs can arise due to the use of indium-containing metal alloys and the adhesive polymer sheets (in the case of SWCT), and expensive proprietary tabbing equipment or mechanical actuators required to perform the interconnection processes at the manufacturers' factories.

Part of the complexity required by the wire processing equipment arises due to the use of continuous preformed wires. For series-interconnection of the most commonly-produced solar cells which have electrodes on both surfaces, the wires must extend from the p-type surface of one cell to the n-type surface of the adjacent cell (i.e., from the front to rear surface of cells). The tabbing equipment must therefore include either wire cutting and bonding functionality or complex cell layout capability.

The use of wires also limits the flexibility of the interconnection arrangement. Historically solar modules have used bypass diodes to mitigate the impact of localized shading by providing an alternative current pathway in parallel to the cell string that can prevent power being dissipated in non-shaded cells and causing localized heating. With the reduced cost of module-based electronics, string DC/DC optimisers and different series/parallel configurations can be used as alternatives to bypass diodes. If the string-level DC/DC optimisers can be integrated into the module in a way that allows them to be replaced on failure, then this can provide benefits over the case where bypass diodes are integrated within the encapsulated solar module. There is therefore an opportunity to design interconnection circuitry in such a way that bypass diodes can be dispensed with in favour of more flexible, replaceable on failure, module-level circuitry.

The high costs of wire-based interconnection schemes that rely on metal alloy bonding during lamination arise in part because the entire surface of the alloy-coated wires must be coated with the metal alloy material. This factor results in increased material costs, which can be considerable if expensive metals (e.g., indium) must be used to achieve reliable bonding to the metal fingers on the solar cell.

An improvement to the process of fabrication of solar modules is needed.

SUMMARY OF THE INVENTION

In a first aspect of the present invention there is provided a method of forming a device structure, the method comprising:
 providing at least one device component having front and rear device component surfaces and having at least one electrically conductive region on at least one of the device component surfaces;
 providing at least one contact sheet comprising a polymeric material and at least one electrically conductive element that has a non-circular cross-sectional shape and is embedded in the polymeric material in a manner such that a surface portion of the at least one electrically conductive element is exposed;
 applying a bonding material to either one or both of the exposed surface portion and at least one of the electrically conductive regions on the at least one of the device component surfaces;
 positioning the at least one contact sheet relative to the at least one device component such that the bonding material is located between the at least one electrically conductive region and the exposed surface portion; and
 activating the bonding material such that a bond and an electrically conductive coupling is formed between the at least one electrically conductive region and the exposed surface portion.

In one embodiment, the at least one electrically conductive element comprises at least one projection and/or at least one recess, the at least one projection and/or the at least one recess being arranged such that, when the at least one electrically conductive element is embedded in the polymeric material, the polymeric material at least partially surrounds the at least one projection and/or at least partially fills the at least one recess, wherein the at least one projection and/or the at least one recess has an anchoring function, which facilitates securing the at least one electrically conductive element within the polymeric material of the at least one contact sheet.

The at least one electrically conductive element may have a polygonal cross-sectional shape.

In one embodiment providing the at least one contact sheet comprises:
 providing a sheet comprising a polymeric material;
 forming at least one recess portion within the sheet comprising a polymeric material, the at least one recess portion being arranged to receive the at least one electrically conductive element;
 providing the at least one electrically conductive element;
 placing the at least one conductive element into a respective recess portion; and
 applying heat to the polymeric material and subsequently allow cooling of the polymeric material such that the at least one conductive element and the polymeric material adhere to each other and the at least one electrically conductive element is embedded in the polymeric material and the surface portion of the electrically conductive element is exposed.

Providing the at least one contact sheet may also comprise:
 providing a sheet comprising a polymeric material, the sheet comprising the polymeric material having at least one recess portion, the at least one recess portion being arranged to receive the at least one electrically conductive element;
 providing the at least one electrically conductive element;
 placing the at least one conductive element into a respective recess portion; and
 applying heat to the polymeric material and subsequently allow cooling of the polymeric material such that the at least one conductive element and the polymeric material adhere to each other and the at least one electrically conductive element is embedded in the polymeric material and the surface portion of the electrically conductive element is exposed.

Placing the at least one electrically conductive element into a respective recess portion may comprise press-fitting the at least one electrically conductive element into the respective recess portion.

In an alternative embodiment, providing the at least one contact sheet comprises:
 providing a sheet comprising a polymeric material;
 providing an electrically conductive element;
 providing a thermally conductive stamping device that is arranged to receive the conductive element;
 heat pressing the electrically conductive element into the sheet using the stamping device such that the polymeric material adheres to the electrically conductive element, whereby the electrically conductive element is embedded in the polymeric material such that a surface portion of the electrically conductive element is exposed; and separating the thermally conductive stamping device from the electrically conductive element.

In one embodiment, the at least one device component has at least one electrically conductive region at each of the front and rear device component surfaces and the method further comprises:

providing a front contact sheet comprising a polymeric material and at least one electrically conductive element that has a non-circular cross-sectional shape and is embedded in the polymeric material such that a surface portion of the at least one electrically conductive element is exposed;

providing a rear contact sheet comprising a polymeric material and at least one electrically conductive element that has a non-circular cross-sectional shape and is embedded in the polymeric material such that a surface portion of the at least one electrically conductive element is exposed;

positioning the front contact sheet and the rear contact sheet relative to the at least one device component such that the exposed surface portions of the at least one conductive element of each of the front and the rear contact sheets face the conductive regions on the front and rear device component surfaces, respectively;

applying a bonding material onto (i) either one or both of the exposed surface portion of the at least one electrically conductive element of the front contact sheet and the at least one electrically conductive region of the front device component surface of the at least one device component, and (ii) either one or both of the exposed surface portion of the at least one electrically conductive element of the rear contact sheet and the at least one electrically conductive region of the rear device component surface of the at least one device component;

positioning the front and rear contact sheets relative to the at least one device component such that the bonding material is located between the at least one electrically conductive region of the front device component surface and the exposed surface portion of the front contact sheet and between the at least one electrically conductive region of the rear device component surface and the exposed surface portion of the rear contact sheet; and activating the bonding material such that the bonding material forms electrically conductive couplings, wherein the electrically conductive elements of the front and rear contact sheets are electrically coupled to electrically conductive regions of the front and rear device component surfaces, respectively.

In this embodiment, the at least one device component may comprise a first device component having first front and rear device component surfaces and an adjacent second device component having second front and rear device component surfaces, each one of the first and adjacent second device components being positioned between the front contact sheet and the rear contact sheet, wherein the front and rear contact sheets are arranged and the method is conducted such that the first and second device components are interconnected, such as interconnected in series or parallel, by conductive elements of the front sheet and/or rear sheets.

The method may comprise forming an electrically conductive bond between at least one electrically conductive element of the front sheet, which in use electrically coupled to at least one electrically conductive region of the first front device component surface, and at least one electrically conductive elements of the rear sheet, which in use electrically coupled to at least one electrically conductive region of the second rear device component surface in a manner such that the first device component and the adjacent second device component are electrically interconnected in series.

In one embodiment, the device structure is a solar module and the or each device component is a solar cell.

In one embodiment, activating the bonding material comprises applying heat to the at least one contact sheet.

The present invention provides in a second aspect a device structure comprising:

at least two adjacent device components each having front and rear device component surfaces, and each having an electrically conductive region on at least one of the device component surfaces;

at least one front contact sheet comprising a polymeric material and at least one conductive element that has a non-circular cross-sectional shape and is embedded in the polymeric material such that a portion of the conductive element is exposed; and at least one rear contact sheet comprising a polymeric material and at least one conductive element that has a non-circular cross-sectional shape and is embedded in the polymeric material such that portion of the conductive element is exposed;

wherein the at least two adjacent device components are positioned between the front contact sheet and the rear contact sheet;

wherein the electrically conductive elements of the front and rear contact sheets are bonded and electrically coupled to respective electrically conductive regions of the at least two adjacent device components such that the at least two adjacent device components are electrically interconnected in series; and wherein the device structure is formed using the method in accordance with the first aspect of the present invention.

In one embodiment, the at least one electrically conductive element of the at least one front contact sheet comprises at least one projection and/or at least one recess, the at least one projection and/or the at least one recess being arranged such that, when the at least one electrically conductive element is embedded in the polymeric material, the polymeric material at least partially surrounds the at least one projection and/or at least partially fills the at least one recess, wherein the at least one projection and/or the at least one recess has an anchoring function, which facilitates securing the at least one electrically conductive element within the polymeric material of the at least one contact sheet.

Alternatively or simultaneously, the at least one electrically conductive element of the at least one rear contact sheet may comprise at least one projection and/or at least one recess, the at least one projection and/or the at least one recess being arranged such that, when the at least one electrically conductive element is embedded in the polymeric material, the polymeric material at least partially surrounds the at least one projection and/or at least partially fills the at least one recess, wherein the at least one projection and/or the at least one recess has an anchoring function, which facilitates securing the at least one electrically conductive element within the polymeric material of the at least one contact sheet.

The at least one electrically conductive element of the at least one front contact sheet and/or the at least one electrically conductive element of the at least one rear contact sheet may have a polygonal cross-sectional shape.

In one embodiment, the device structure is a solar module and the at least two adjacent device components are solar cells.

In accordance with a third aspect of the present invention there is provided a structured connector for positioning on, and electrically coupling to, a surface of a device component, the connector being formed from an electrically conductive material and having recesses and/or projections in side and/or bottom portions whereby the connector is arranged such that, when the connector is partially embedded into a polymeric material of a polymeric contact sheet, the polymeric material at least partially fills the recesses or spaces between projections and the recesses and/or projections have an anchoring function, which facilitates securing the connector within the polymeric material of the polymeric contact sheet.

Throughout this specification the term 'structured' is used to indicate a non-circular cross-sectional shape.

In one embodiment, the connector has a cross-sectional shape corresponding to an outline of at least two overlapping triangular portions, each triangular portion having an axis and being oriented such that the axis of one of the triangular portions coincides with the axis of the at least one other triangular portion.

The connector may have an axis and recesses and/or projections in side and bottom portions that are arranged such that a shape of the connector in a cross-sectional plane perpendicular to the axis has a three-fold rotational symmetry.

In a fourth aspect of the present invention there is provided a device for embedding a portion of a structured wire into an polymeric material such that a first longitudinal portion of the structured wire is exposed along at least a portion of the length of the structured wire and a second longitudinal portion of the structured wires is embedded within the polymeric material along the same length portion of the structured wire, the device having a body portion that has an elongated recess for receiving the first longitudinal portion of the structured wire and the elongated recess having a shape that approximates that of the first longitudinal portion of the structured wire, the body portion being arranged for heating the structured wire such that, when the first longitudinal portion of the structured wire is received in the recess, the device can heat the structured wire and, when second longitudinal portion of the structures wire is contacting, or pressed against, the polymeric material, the polymeric material locally melts such that the second longitudinal portion of the structured wire can penetrate into the polymeric material, whereby the second longitudinal portion of the structured wire is embedded within the polymeric material after the solidifying of the polymeric material (for example by cooling the polymeric material or interrupting heating of the polymeric material).

The device may comprise through-holes that penetrate from a bottom portion of the elongate recess through the body portion such that the through-holes can be used the access the first longitudinal portion of the structures wire and push the structured wire out of the elongated recess when the second longitudinal portion of the structures wire is embedded within the polymeric material.

Further, the device may be arranged such that vacuum suction can hold the first longitudinal portion of the structured wire within the elongated recess of the body portion. The device may also be arranged such that air pressure within at least a portion of the recess can be increased to push the first longitudinal portion out of the elongated recess when required.

BRIEF DESCRIPTION OF THE DRAWINGS

Notwithstanding any other forms which may fall within the scope of the disclosure as set forth in the Summary, specific embodiments will now be described, by way of example only, with reference to the accompanying drawings in which:

FIG. 9 is a flow chart of a method of forming a device structure in accordance with an aspect of the present invention;

FIGS. 20(a)-(c) to 21(a)-(c) are schematic perspective and cross-sectional representations of structured connectors and of a device used for embedding the respective structured connectors in a polymeric material of a contact sheet in accordance with further embodiments of the present invention;

DETAILED DESCRIPTION OF EMBODIMENTS

Figure 1:
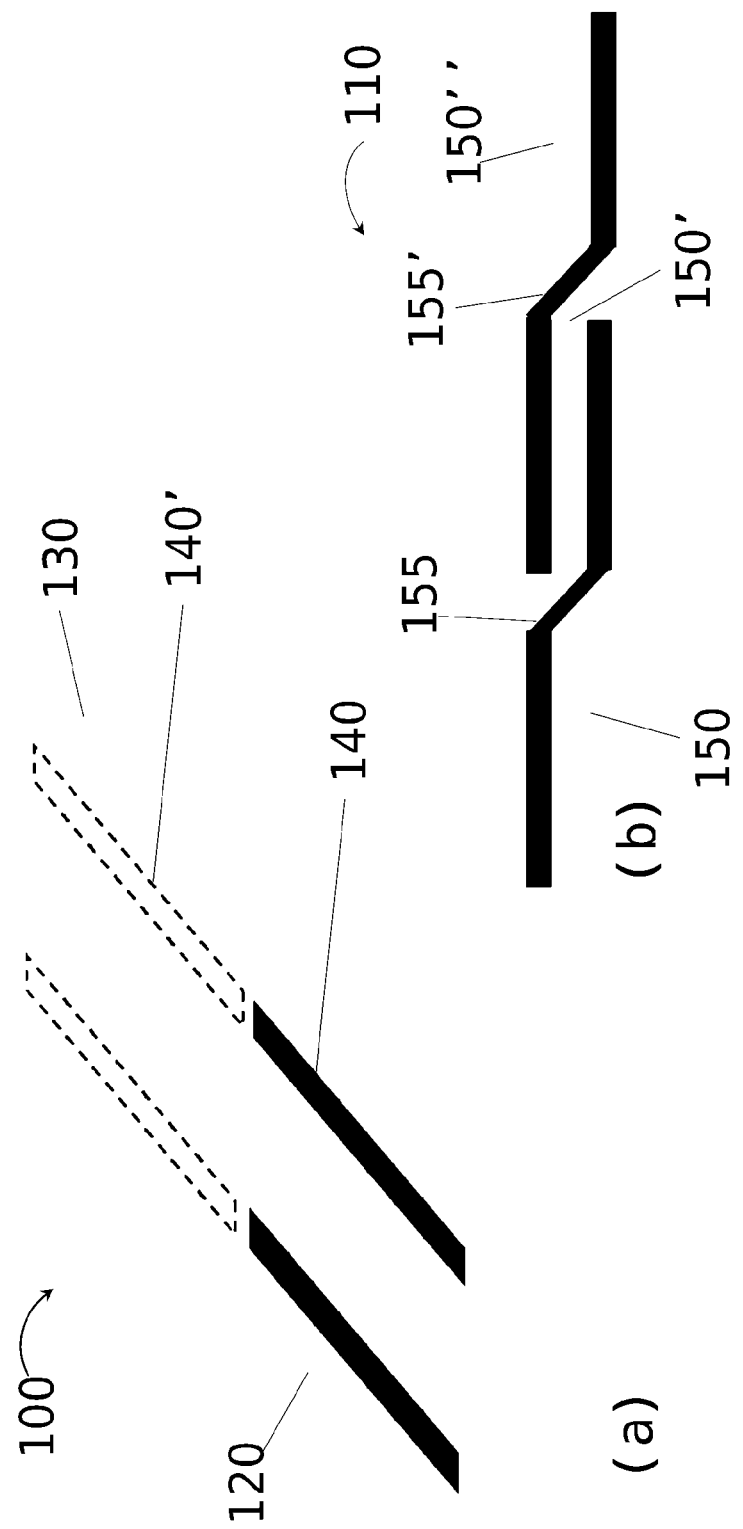
FIG. 1(a) is a schematic diagram that depicts a perspective view of a known structure of a solar cell.
FIG. 1(b) is a schematic diagram that depicts a cross-sectional view of a known configuration for connecting adjacent solar cells in a photovoltaic module using existing solar cell connectors.

Embodiments of the present invention thus relate generally to structured connectors, i.e. connectors having a non-circular cross-sectional shape, for positioning on, and electrically coupling to, a surface a device component, such as a solar cell, whereby the structured connectors further allow connecting device components, such as solar cells, within a device structure, such as a photovoltaic module.

Further, embodiments of a method for forming a device structure will be described, the method allowing the interconnection of device components within the device structure by means of structured connectors as provided in accordance with embodiments of the present invention.

In the following description, embodiments of a structured connector will in particular be described in relation to a solar cell structured connector for interconnecting solar cells within a photovoltaic module. Embodiments of a structured connector in relation to a method of forming a photovoltaic module will also be described.

It will however be understood that embodiments of the present invention are not limited to device components being solar cells and a device structure being a photovoltaic module. Applications to other device components and structures, such as optical device components and structures, or any electrical or electronic device components and structures are also considered to be within the scope of the present invention.

Further, it will be understood that although embodiments of the present invention are described with reference to silicon solar cells and a silicon photovoltaic module, solar cells and modules comprising other photovoltaic materials are also considered to be within the scope of the present invention.

With reference to FIGS. 1 to 11, embodiments of a structured connector for interconnecting device components, such as solar cells, within a device structure, such as a photovoltaic module, will now be described.

FIG. 1(a) shows a known structure of a solar cell 100 and FIG. 1(b) shows a known configuration 110 for interconnecting adjacent solar cells of a photovoltaic module using existing solar cell connectors.

The solar cell 100 typically has a front surface 120 and a rear surface 130, each of the front surface 120 and the rear surface 130 comprising electrical contacts or metal fingers 140, 140'. Solar cell connectors are electrically conductive elements that are typically arranged to connect the electrical contacts 140 on the front surface 120 of one solar cell, such as solar cell 100, to the electrical contacts 140' on the rear surface 130 of another adjacent solar cell 100'. The connecting structure 110 illustrates the interconnection of adjacent solar cells 150, 150', 150" using solar cell connectors 155, 155'.

Existing solar cell connectors may have various cross-sectional shapes. For example, most common designs of existing solar cell connectors include a flat ribbon having a rectangular cross-section or wires with a circular cross-section.

In use, as the solar cell connectors are positioned on, and electrically coupled to, respective surfaces of the solar cells, first an encapsulant sheet and then a cover sheet comprising a glass material and/or a polymeric material, can be positioned over the solar cells and connectors for forming a photovoltaic module.

The flat ribbon having a rectangular cross-sectional shape presents the disadvantage that, when the ribbon is positioned on, and electrically coupled to, a surface of a solar cell with the bottom portion of the ribbon contacting the surface of the solar cell, light that is in use received by a top surface of the ribbon at a normal angle of incidence (relative to a surface of the solar cell) is typically reflected directly back towards the cover sheet within an escaping cone of the cover sheet, leading to high optical loss, and thereby affecting the generation of electric current and the power enhancement of the photovoltaic module. However, this optical loss is balanced by a larger contact area that can reduce the resistance of current flow from the solar cell into the connector. The low-aspect ratio of the connector having the rectangular cross-sectional shape also acts to minimise stress in the silicon wafer of the solar cell. High stress can result in microcracks forming in the silicon wafers which reduces the photovoltaic module durability and hence lifetime. With the trend towards reducing silicon wafer thickness for reduced material cost, reducing stress in silicon wafers caused by the shape of the connector becomes increasingly important.

The connector having a circular cross-sectional shape is such that, when it is positioned on, and electrically coupled to, a surface of a solar cell, a substantial part of the normal incident light can in use be diverted or scattered back towards the surface of the solar cell, which allows reducing the effective optical width. However, a part of the normal incident light is also reflected directly back towards the encapsulant sheet and/or glass and/or polymer cover sheet within the defined escaping cone of the glass and/or polymeric cover sheet, which results in an optical loss. Further, the contact area provided by such circular or round connectors on the electrical contacts of the solar cells is relatively small, which may lead to poor adhesion of the connector onto the electrical contact and resulting in high resistivity and high resistive loss.

The above-mentioned limitations of connectors having respective rectangular and round cross-sectional shapes can be addressed by using connectors that are specifically structured to improve optical performance, allow sufficient contact area for low resistance interconnection and minimise thermomechanical stress from evolving in the silicon wafers of modules.

A first design approach is to use a light scattering ribbon (LSR) connector which has a scattering pattern on one surface of a connector having a substantially rectangular cross-sectional shape with a low aspect-ratio. An example of a LSR connector is a series of relatively flat V-grooves aligned along the ribbon surface.

The LSR, when positioned on, and electrically coupled to, a surface of a solar cell (with a bottom portion of the LSR contacting the surface of the solar cell), allows the light directed at normal incidence relative to the surface of the solar cell and received by top surface portions of the LSR to be scattered towards the encapsulant sheet and/or glass and/or polymer cover sheet at an angle beyond the escaping cone, such that the light is then internally reflected back towards an exposed surface of the solar cell.

Another approach is to use a light-diverting ribbon (LDR) structured connector. The LDR, when positioned on, and electrically coupled to, a surface of a solar cell (with a bottom portion of the LDR contacting the surface of the solar cell), allows the light directed at normal incidence relative to the surface of the solar cell and in use received by side surface portions of the LDR to be diverted towards an exposed surface of the solar cell directly. An example of a LDR connector is a connector with a triangular cross-section, where light can be diverted from each of the two faces of the connector whilst the third face makes electrical contact with the solar cell.

The LSR and the LDR are examples of structured connectors that typically allow redirecting all normal incident light towards an exposed surface of the solar cells, which, under standard test conditions, is advantageous for the assessment and determination of the power enhancement of the photovoltaic module. However, in practical use, the photovoltaic module receives solar radiation from varying incident angles and the performance of the solar cell connectors at such varying incident angles typically determines the electricity yield of the photovoltaic module.

Figure 2:
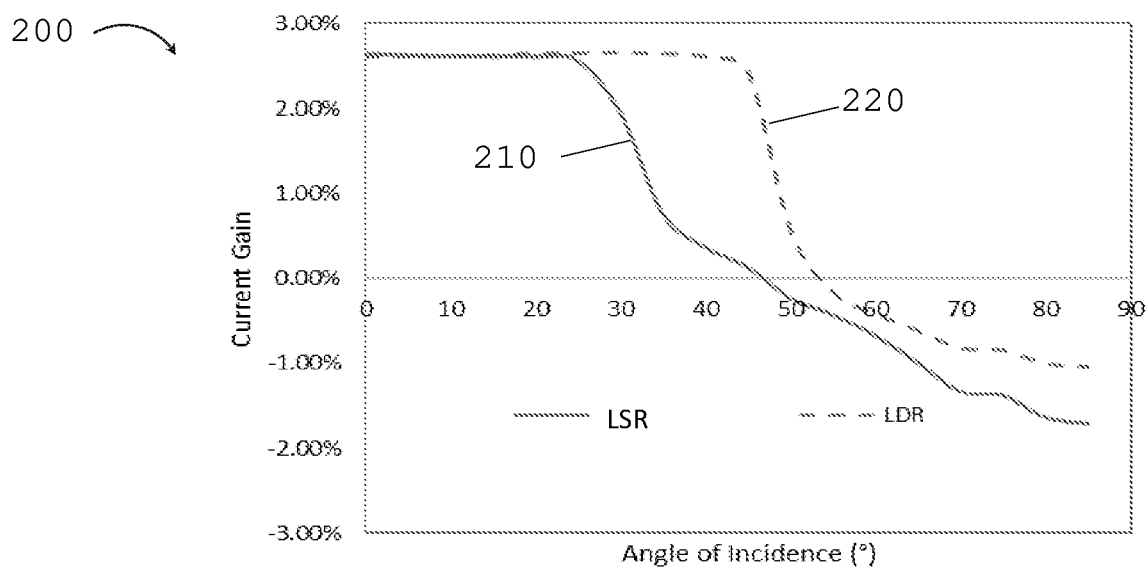
FIG. 2 is a graph illustrating a potential gain of electric current as a function of an angle of incidence of the light for connectors employing light scattering ribbons (LSR) and light diverting ribbons (LDR)

With reference to the graph 200 of FIG. 2, there are shown plots 210 and 220 of a potential gain of electric current as a function of an angle of incidence of the light relative to a surface of the solar cell obtained for the LSR and the LDR, respectively. It is observed that while the LSR and LDR provide a similar gain from an angle of incidence of 0° (normal incidence relative to the surface of the solar cell) to approximately 30°, as the angle of incidence then increases, the potential gain of electric current decreases for both the LSR and LDR. Specifically, the current gain of the LSR starts decreasing from an incident angle of about 28°, for which the light received at the surfaces of the V-grooves at the top portion of the connector is reflected at an angle close to within the escaping cone of the glass and/or polymer cover sheet. The current gain of the LDR starts decreasing from an incident angle of about 49°, at which angle the light received at the side surfaces of the triangle-shaped connector may be diverted in a direction parallel to the surface of the solar cell or back towards the glass and/or polymer cover sheet at an angle close to within the escaping cone.

The LDR, besides remaining relatively effective in terms of the current gain for a relatively wide range of incident angles (from 0° to approximately 49°), however has a relatively small conducting cross-sectional area, which is about 50% smaller than the conducting cross-sectional area provided by a connector having a rectangular cross-sectional shape with the same width and height as the LDR, and about 50% smaller than the conducting cross-sectional area provided by a connector having a circular cross-sectional shape. As a consequence, the LDR may lead to higher resistive loss, as compared to other known structured connectors, and reduced electrical efficiency. The LDR may further be required to be bulkier so as to reduce such resistive loss, which would however result in a bigger height and may potentially cause higher stress into the encapsulant sheet and/or the glass and/or polymer cover sheet during the lamination process (for encapsulation of the solar cells and connectors, and formation of the photovoltaic module) and may also result in an increased internal stress in the solar cell.

Embodiments of the present invention seek generally to provide structured connectors having a structure that allows improving current gain of the connectors as a function of the angle of incidence of the light received at a surface of the connectors relative to a surface of respective device components, while improving the conductivity of the connectors and reducing stress into the device components, and the encapsulant sheet and/or glass and/or polymer cover sheet in the case of solar cells, as a result of the process of encapsulation.

FIGS. 3(a)-(b) show cross-sectional views of a structured connector 300 provided in accordance with an embodiment of the present invention for positioning on, electrically coupling to, a surface of a device component such as a solar cell. The structured connector 300 is shown in FIGS. 3(a)-(b) positioned on, and electrically coupled to, a surface 310 of a device component 320. The structured connector 300 has a bottom portion 330 for contacting the surface 310 of the device component 320, is formed from an electrically conductive material and comprises:
i) at least one light diverting surface portion, such as n light diverting surface portion 340, that is oriented relative to the surface 310 of the device component 320 such that, in use, light directed at normal incidence relative to the surface 310 of the device component 320 is received by the at least one light diverting surface portion such that the received light is diverted towards an exposed adjacent surface 310' of the device component 320, and
ii) at least one light scattering surface portion, such as light scattering surface portion 375, that is oriented relative to the surface 310 of the device component 320 such that, in use, light directed at normal incidence relative to the surface 310 is received by the at least one light scattering surface portion such that the received light is scattered in a direction away from the device component 320.

Specifically, in accordance with the specific embodiment illustrated in FIGS. 3(a) and 3(b), the structured connector 300 has a non-circular cross-sectional shape and has, when positioned and electrically coupled to the surface 310 of the device component 320, two flat light diverting surface portions 340, 345 that are oriented relative to the surface 310 of the device component 320 such that, in use, light 385 directed at normal incidence relative to the surface 310 is received by the flat light diverting surface portions 340, 345 and diverted directly towards (diverted light 385") the exposed adjacent surface 310'. The connector 300 also has two flat light scattering surface portions 375, 375' that are oriented relative to the surface 310 of the device component 320 such that, in use, light 385 directed at normal incidence relative to the surface 310 is received by the flat light scattering surface portions 375, 375' and scattered in a direction away (scattered light 385') from the device component 320. In one specific embodiment, the device component 320 and structured connector 300 are covered by and/or encapsulated between glass and/or polymer cover sheets, such as cover sheet 305 shown in FIGS. 3(a) and 3(b). In use, the light 385 received by the light scattering surface portions 375, 375' is scattered away from the device component 320 towards a surface of the glass (and/or polymer) cover sheet 305, where the light 385 is internally reflected back towards the adjacent surface 310' of the device component 320.

It will be understood that the term 'flat' used throughout the specification is not to be interpreted in a strict sense, and that the light diverting surface portions and the light scattering surface portions may be substantially flat, i.e. flat to a certain extent to achieve the light scattering and light diverting effect in accordance with embodiments of the present invention.

In a specific embodiment of the present invention, the device component 320 is, and will now be referred to, as a solar cell, and the structured connector 300 is, and will now be referred to indifferently as 'structured solar cell connector(s)', 'structured connector(s)', and/or 'structured wire (s).

As illustrated in FIG. 3(b), each of the light diverting surface portions 340, 345 is positioned at a respective one of opposite side portions 350, 355 of the structured connector 300 and is oriented at an obtuse outside angle b1 relative to the surface 310 of the solar cell 320, or a plane parallel to the surface 310 of the solar cell 320 as the structured connector 300 is positioned on the surface 310. The obtuse outside angle b1 typically ranges from 45 degrees to 90 degrees.

Further, as illustrated in FIG. 3(b), each of the light scattering surface portions 375, 375' is positioned at a top portion 360 of the structured connector 300 and is oriented at an acute inside angle b2 relative to the surface 310 of the solar cell 320, or a plane parallel to the surface of the solar cell, when the structured connector 300 is positioned on the surface 310. The acute inside angle b2 typically ranges from 0 degree to 45 degrees.

While the values for angles b1 and b2 may be varied in order to achieve given diverting and scattering properties, the inventors have found, based on computer simulations, that an optimum value for b1 is 60° and an optimum value for b2 is 30° for achieving optimum scattering and diverting properties of the structured connector 300 and optimum current gain.

The two light scattering surface portions 375, 375' form a recess 370 that extends along the structured connector 300 at the top portion 360, the recess being positioned between the opposite side portions 350, 355.

In the present specific embodiment, the recess 370 is specifically configured such that the flat light scattering surface portions 375, 375' form a v-groove extending along the structured connector 300 at the top portion 360, wherein the flat light scattering surface portions 375, 375' meet at the bottom 380 of the recess 370. Further, as seen in FIGS. 3(a) and 3(b), the flat light diverting surface portion 340 meets the flat light scattering surface portion 375, and the flat light diverting surface portion 345 meets the flat light scattering surface portion 375'.

As seen in FIGS. 3(a)-(b), the structured connector 300 comprises the opposite side portions 350, 355, which constitute upper opposite side portions, and opposite side portions 350', 355', which constitute lower opposite side portions. A lower opposite side portion meets a respective upper side portion as the lower side portion 350' meets the upper side portion 350 and the lower side portion 355' meets the upper side portion 355. The structured connector 300 is arranged such that, when positioned on the surface 310 of the solar cell 320, the lower opposite side portions 350', 355' are oriented substantially perpendicular to the surface 310 of the solar cell 320.

Thus, the structured connector 300 comprises a base part 390 having a rectangular (or substantially rectangular) cross-sectional shape formed by the lower opposite side portions 350', 355' and the bottom portion 330, and an upper part 395 formed by the upper opposite side portions 350, 355 and the top portion 360. The upper part 395 generally has a cross-sectional triangular (or substantially triangular) shape having its top vertex cropped by a v-groove opening, thereby forming recess 370 in the top portion 360. In the present embodiment, the upper part 395 defines a height h1 of the connector relative to a top surface of the base part 390 with h1 ranging from about 0.1 mm to about 0.5 mm. The base part 390 defines a height h2' relative to the surface 310 of the solar cell 320 ranging from about 0 mm to 0.5 mm. In particular, the heights h1 and h2' may be varied to achieve specific light scattering and light diverting properties of the structured connector 300. The height h1 of the upper part 395 in particular determines an amount of light scattering and light diverting (due to (i) the obtuse outside angle of the flat light diverting surface portions 340, 345 relative to the surface 310 of the solar cell 320, and (ii) the acute inside angle of the flat light scattering surface portions 375, 375' relative to each other), and consequently has an effect on the optical performance of the connector 300.

Further, the inventors have found that an optimum height h2' is approximately 0.2 mm while an optimum height h1 is approximately half of the height of an LDR, which is typically about 0.4 mm. The heights h1 and h2' of the base part 390 and upper part 395, respectively, define an overall height h2 of the structured connector 300 ranging from 0.1 mm to 0.8 mm. This overall height affects the stress applied to the solar cell 320 and the encapsulating glass (and/or polymer) cover sheets during the manufacturing process of the photovoltaic module. The cross-sectional area of the structured connector 300 also affects the conductivity of the structured connector 300. Specifically, the structured connector 300 is configured to have a cross-sectional area similar to the cross-sectional area of the LDR however has a different greater height than the LDR, which allows reducing the stress applied to the solar cell 320 during the manufacturing process of the photovoltaic module.

Figure 4:
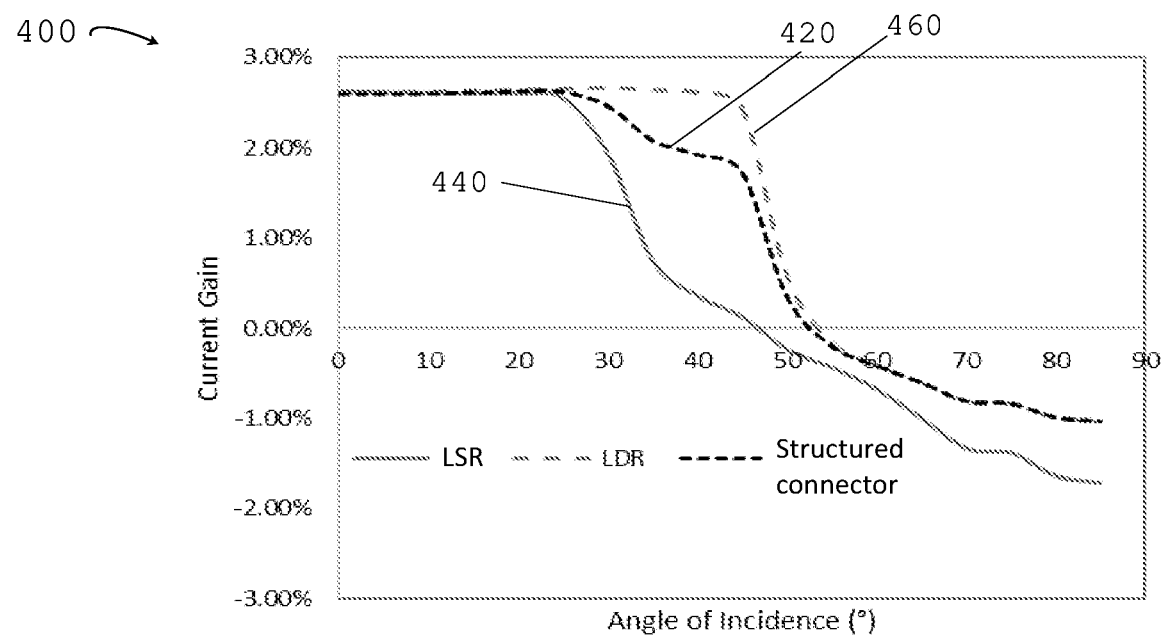
FIG. 4 is a graph illustrating a potential gain of electric current as a function of an angle of incidence of the light for a structured connector provided in accordance with the embodiment of FIG. 3 compared with the LSRs and LDRs of FIG. 2.

FIG. 4 shows a graph 400 illustrating a curve 420 of a potential gain of electric current as a function of an angle of incidence of the light (relative to a surface of a solar cell) obtained for the structured solar cell connector 300 as compared to the known solar cell connectors LSR and LDR (current gain curves 440 and 460). It is observed that at about normal incidence, the structured connector 300 performs similarly to the LSR and the LDR, and as the angle of incidence increases, the structured connector 300 allows achieving a value of the current gain that is between the respective values of current gain achieved for the LSR and the LDR. In particular, for an angle of incidence between 60° and 90°, the structured connector 300 performs similarly to the LDR. Thus, the present structured connector 300 allows maintaining an optical and electrical performance similar to the one of the LDR, while the adjustable height of the structured connector 300 further enables achieving a reduced stress for the solar cell during the manufacture of a photovoltaic module. The structured connector 300 in accordance with embodiments of the present invention thus allows achieving a balanced optimized performance, in terms of balancing power enhancement efficiency and application of stress to the solar cell and encapsulant sheet and/or glass/polymer cover sheet.

Figure 5:
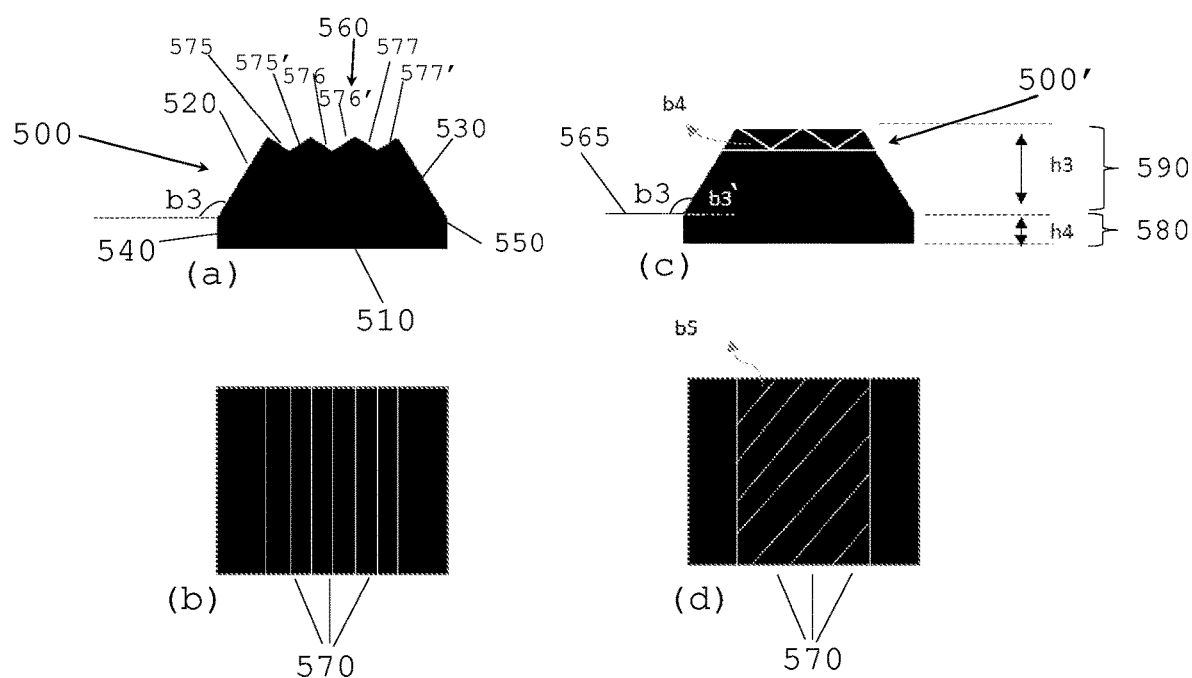
FIGS. 5(a) and 5(c) are schematic diagrams depicting cross-sectional front views of structured connectors provided in accordance with a further embodiment of the present invention.
FIGS. 5(b) and 5(d) are schematic diagrams depicting top views of the structured connectors of FIGS. 5(a) and 5(c)

FIGS. 5(*a*)-(*d*) show cross-sectional front views of structured connectors provided in accordance with further embodiments of the present invention.

Specifically, FIG. 5(*a*) shows a cross-sectional front view of solar cell structured connector 500 for positioning on, and electrically coupling to, a surface of a solar cell (not shown), the structured connector 500 having, similarly to structured connector 300, a bottom portion 510 for contacting the surface of the solar cell. The structured connector 500 is formed from an electrically conductive material. FIG. 5(*b*) shows a corresponding top view of the structured connector 500.

The structured connector 500 comprises two light diverting surface portions 520, 530 that may be flat, and are each oriented at an obtuse outside angle b3 relative to the surface of the solar cell, when the structured connector 500 is positioned on the surface of the solar cell. The structured connector 500 further comprises a plurality of light scattering surface portions 575, 575', 576, 576', 577, 577' at a top portion 560 between the light diverting surface portions 520, 530. Each light scattering surface portion 575, 575', 576, 576', 577, 577' may be flat, and is oriented at an acute inside angle relative to the surface of the solar cell. The plurality of light scattering surface portions 575, 575', 576, 576', 577, 577' form a plurality of adjacent and parallel recesses 570 extending along the structured connector 500 at the top portion 560 of the structured connector 500. The plurality of light scattering surface portions is arranged such that the adjacent and parallel recesses 570 form adjacent and parallel v-grooves along the structured connector 500 at the top portion 560.

Similarly to structured connector 300, the light diverting surface portions 520, 530 may be oriented at an obtuse outside angle b3 ranging from 45 degrees to 90 degrees relative to the surface of the solar cell. The light scattering surface portions of the structured connector 500 have an obtuse angle relative to each other and each one of the light scattering surface portions has an acute inside angle b4 ranging from 0 degree to 45 degrees relative to the surface of the solar cell or a plane parallel to the surface of the solar cell when the structured connector 500 is positioned on the surface of the solar cell.

Further, the structured connector 500 has a base part 580 having a rectangular cross-section formed by lower opposite side portions 540, 550 and the bottom portion 510, and an upper part 590 formed by the upper opposite side portions or light diverting surface portions 520, 530 and the top portion 560. The base part 580 has a height h4 and the upper part 590 has a height h3.

FIG. 5(*c*) shows a cross-sectional front view of solar cell structured connector 500' for positioning on, and electrically coupling to, a surface of a solar cell (not shown) and FIG. 5(*d*) shows a corresponding top view of the structured connector 500.

Structured connector 500' has features substantially identical to the features defining structured connector 500 however, while the adjacent and parallel recesses or v-grooves 570 are arranged parallel to each other and extend in a direction parallel to a longitudinal direction of the structured connector 500, in the alternative embodiment of structured connector 500', the adjacent v-grooves 570 extend parallel to each other and are respectively oriented at an angle b5 relative to a plane extending in a longitudinal direction of the structured connector 500' perpendicularly to a surface of the solar cell when the structured connector 500' is positioned on the surface of the solar cell.

For both structured connectors 500, 500', the plurality of recesses at the top portion of the structured connector and the base portion allow increasing the cross-sectional area of the connector, as compared to the known LDR and also as compared to the structured connector 300, which allows achieving a substantially enhanced conductivity of the structured connector 500, 500' while preserving a relatively optimal optical performance as compared to other existing solar cell connectors.

Figure 6:
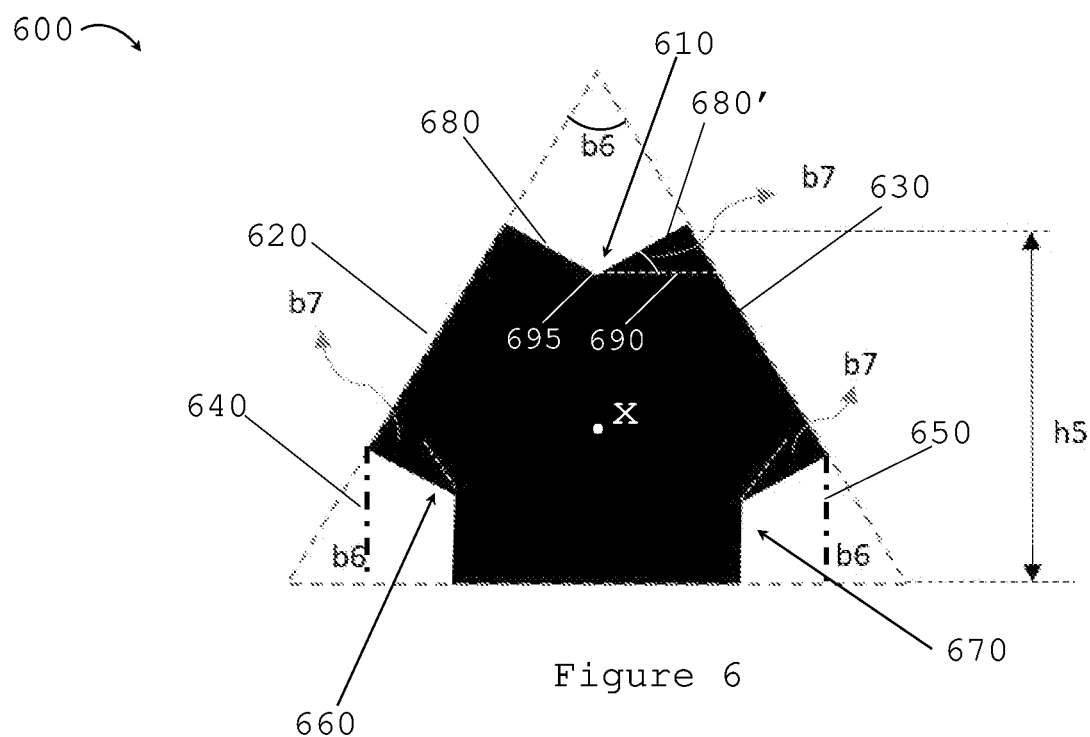
FIG. 6 is a schematic diagram depicting a cross-sectional front view of a structured connector provided in accordance with a further embodiment of the present invention.
Figure 7:
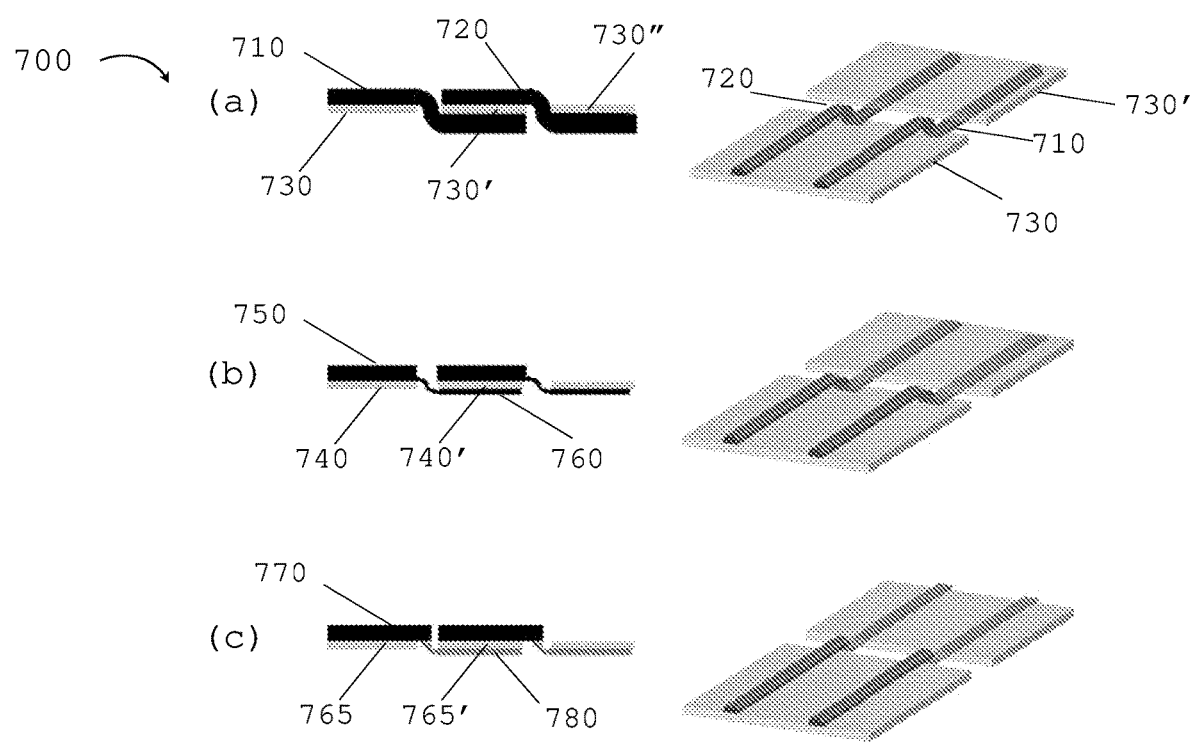
FIGS. 7(a)-(c) are schematic diagrams that depict cross-sectional front views of various processes for connecting adjacent solar cells in a photovoltaic module in accordance with embodiments of the present invention.
Figure 8:
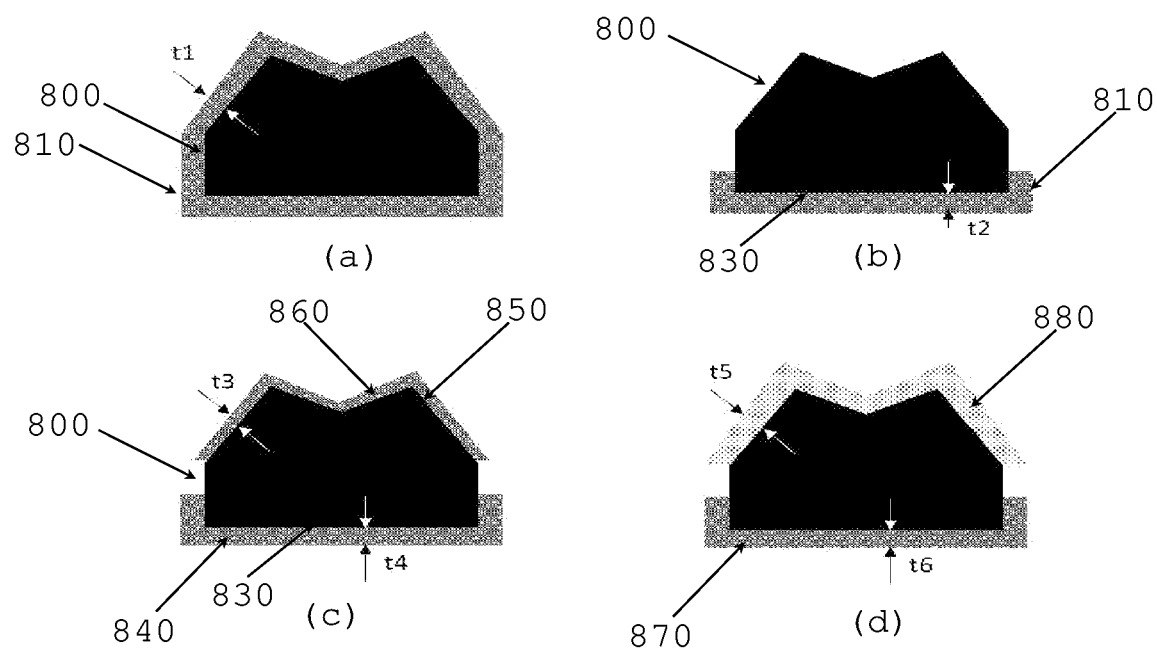
FIGS. 8(a)-(d) are schematic diagrams that depict various coating processes for applying a coating material onto the structured connector of FIG. 3.

FIG. 6 shows a structured solar cell connector 600 in accordance with a further embodiment of the present invention.

In this embodiment, the structured connector 600 has a structure that presents some features substantially similar to features of structured connector 300. The structured connector 600 has a non-circular cross-sectional shape and has light scattering surface portions 680, 680' that may be flat, and define a recess or v-groove 610 at a top portion of the structured connector 600 between light diverting surface portions 620, 630. The light diverting surface portions 620, 630 define upper side portions. However, in contrast with structured connector 300, the lower side portions 640, 650 are cropped to define recesses or v-grooves 660, 670 that are substantially identical to the v-groove 610. The structured connector 600 has an axis x oriented in a longitudinal direction of the structured connector 600 and the recesses 610, 660, 670 are arranged such that the cross-sectional shape of the structured connector 600 in a plane perpendicular to the axis x has a three-fold rotational symmetry.

The structured connector 600 may alternatively initially have a triangular cross-sectional shape in a plane perpendicular to the axis x, wherein the corresponding cross-sectional shape is an equilateral triangle (with angle b6 of 60° at each corner) and wherein three substantially identical v-grooves or recesses 610, 660, and 670 are formed at the three corners of the equilateral triangle, such that the cross-sectional shape of the structured connector 600 in a plane perpendicular to the axis x has a three-fold rotational symmetry.

The structured connector 600 has a height h5 and each of the flat light scattering surface portions 680, 680' are oriented at an angle b7 relative to a plane parallel to a bottom of the respective v-groove. The height h5 and the angle b7 can be varied in order to achieve specific light scattering and light diverting properties.

The structured connectors provided in accordance with embodiments of the present invention typically comprise a material having a relatively high electrical conductivity material and may comprise metallic elements such as copper, silver, aluminium or an alloy of metallic elements. The structured connectors may alternatively or simultaneously comprise other highly electrically conductive materials, and may, for example, comprise conductive polymers.

For the manufacture of a photovoltaic module, various methods of interconnecting solar cells within the photovoltaic module may be used.

For example, as known in the art, the 'solar tabber and stringer' method may be used. In this example a connector is positioned such that the connector is placed in contact with the electrical contacts on a front surface of a first solar cell and a second solar cell is then positioned adjacent the first solar cell with the rear surface of the second solar cell placed on the top portion of the connector such that the connector contacts the electrical contacts on the rear surface of the second solar cell. Thus, the connector connects the electrical contacts on the front surface of the first solar cell to the electrical contacts on the rear surface of the second solar cell. FIG. 7(a) illustrates an example of such a method 700 for interconnecting solar cells. Connectors 710 and 720 (each corresponding to a connector such as structured connector 300, 500 or 600) are positioned relative to adjacent solar cells 730, 730' and 730" in a manner as described above, i.e. wherein the connector 710 connects the electrical contacts on the front surface of the solar cell 730 to the electrical contacts on the rear surface of the adjacent solar cell 730', and the connector 720 connects the electrical contacts on the front surface of the solar cell 730' to the electrical contacts on the rear surface of the adjacent solar cell 730".

With references to FIGS. 7(b) and 7(c), other alternative methods of connecting solar cells may include the following.

Turning initially to FIG. 7(b), the connector may be designed and manufactured as having two structured profiles along the connector, with each of the two profiles extending along half a length of the connector. The length of the connector is determined to be suitable for connecting two solar cells 740, 740'. More specifically, the connector has (i) a first profile 750 in accordance with one of the structures of connectors 300, 500 or 600, the first profile 750 being positioned onto the front surface of solar cell 740, and (ii) a second profile 760 corresponding to a "flat ribbon", the second profile 760 being positioned onto the rear surface of solar cell 740', whereby the electrical contacts on the front surface of the solar cell 740 are connected to the electrical contacts on the rear surface of the adjacent solar cell 740'.

In another example, with reference to FIG. 7(c), the connection of two solar cells 765, 765' may be achieved using two sets of connectors. A first set of connectors is provided wherein the connector has a first profile 770 in accordance with one of the structured connectors 300, 500 or 600, and wherein the first profile 770 is positioned onto the front surface of solar cell 765. A second set of connectors is provided wherein the connector has a second profile 780 corresponding to a flat ribbon having a rectangular cross-sectional shape, and wherein the second profile 780 is positioned onto the rear surface of solar cell 765'. Each of the first set of connectors and each of the second set of connectors has a length that is longer than the width of the solar cell onto which the connectors are positioned such that the respective connectors overlap between the two solar cells 765, 765' at an 'inter-cell region'. The respective first and second connectors can be connected together in the 'inter-cell region' during formation of the photovoltaic module such that the electrical contacts on the front surface of the solar cell 765 are connected to the electrical contacts on the rear surface of the adjacent solar cell 765', and such that conduction of electric current generated by the solar cells is enabled.

The solar cell connector (such as structured connector 300, 500, 600) may be coated with a coating material prior to contacting the electrical contacts of solar cells so as to improve optical and soldering properties.

FIGS. 8(a)-(d) illustrate various coating processes that may be used for coating at least a surface portion of the structured connector provided in accordance with embodiments of the present invention with a material, such as a low melting point metal alloy (a solder, a conductive film or an ECA tape) as a function of desired connection properties. In FIGS. 8(a)-(d), the structured connector 800 is represented, however it will be understood that the coating may also be applied onto surfaces of the structured connectors 300, 500, and 600 and any structured connectors provided in accordance with further other embodiments of the present invention, in a similar manner so as to achieve the same effects.

In particular, the layout and thickness of the coating material may be varied. For example, as illustrated in FIG. 8(a), a coating material 810 may be applied onto all surfaces of the structured connector 800 with a thickness t1 to achieve improved reflection and soldering properties. Alternatively, the coating material 810 may be partially applied onto selected surfaces, such as only the bottom portion 830 of the structured connector 800 with a thickness t2, as illustrated in FIG. 8(b). In again an alternative embodiment, the coating material 810 may be applied on different surfaces of the structured connector 800 with different thicknesses. For example, as illustrated in FIG. 8(c), a layer 840 of coating material 810 having a thickness t4 may be applied at the bottom portion 830 of the structured connector 800 and a thinner layer 850 of coating material 810 having a thickness t3 may be applied onto a top portion 860 of the structured connector 800. Another embodiment, as illustrated in FIG. 8(d), consists in coating respective surfaces of the connector with layers of two or more different coating materials having desired thicknesses. For example, the top portion 860 is coated with a layer of a first given coating material 880 having a first given thickness t5, and the bottom portion 830 of the structured connector 800 is coated with a layer of a second given coating material 870 having a second given thickness t6.

In accordance with another embodiment of the present invention and as will be further described with reference to FIGS. 9 to 21, the structured connector (such as structured solar cell connector 300, 500 or 600) may be, prior to being connected to electrical contacts of solar cells for forming a photovoltaic module, embedded into a polymeric material of a contact sheet in a manner such that a surface portion of the structured connector is exposed. In this embodiment, a coating material may be applied to the structured connector in accordance with the various coating processes illustrated in FIGS. 8(a)-(d) before and/or after formation of the polymeric contact sheet.

For example, a surface portion of the structured connector that is embedded into the polymeric material may be coated to form a reflective surface wherein the surface portion of the structured connector that is surrounded by the polymeric material may be coated with a reflective coating such as Ag, Al, Sn solder and high reflective metal thin films, multilayer dielectric films, metal foils or silver coated reflective cloth. The reflective coating may be applied by air knife, rolling or calendaring, PVD (sputtering, PLD, ALD), CVD, electro-plating, hot-dip galvanizing, spray, and metal foils with adhesive. The surface portion of the structured connector that is exposed when embedded in the polymeric material of the contact sheet can then be coated with a low melting point solder, conductive films or ECA tapes, which can bond to other materials such as metal fingers on solar cells. The metal fingers or electrically conductive regions of the front and rear surfaces of the solar cells may alternatively or additionally be coated with a low melting point solder, conductive films or ECA tapes. Similar to the reflective coating, the low melting point solder can be applied by air knife, rolling or calendaring, electro-plating, hot-dip galvanizing, spray or via dragging welding (dragging a heated iron tip with melted solder from a solder wire). A commercialized ECA tape or conductive films may be directly applied.

With reference to FIG. 9, there is shown a flow chart of a method 900 of forming a device structure such as a photovoltaic module. At step 910, the method 900 comprises providing at least one device component, such as a solar cell, having a front surface and a rear surface, each of the front surface and the rear surface comprising at least one electrically conductive region. At step 930, the method 900 comprises providing at least one contact sheet comprising a polymeric material and at least one structured electrically conductive element that is embedded in the polymeric material in a manner such that a surface portion of the at least one structured electrically conductive element is exposed.

In embodiments of the method 900, the at least one structured electrically conductive element typically corresponds to at least one structured connector such as the structured connector 300, 500, or 600 or any other structured connectors provided in accordance with embodiments of the present invention.

At step 950, the method 900 comprises applying a bonding material to either one or both of the exposed surface portion and at least one of the electrically conductive regions of the front and rear surfaces of the at least one device component or solar cell.

At step 970, the method 900 comprises positioning the at least one contact sheet relative to the at least one device component or solar cell such that the bonding material is located between the at least one electrically conductive region of the one or more device components or solar cells and the exposed surface portion of the at least one structured electrically conductive element or connector.

At step 990, the method 900 comprises activating the bonding material such that a bond and an electrically conductive coupling is formed between the at least one electrically conductive region and the exposed surface portion.

In one specific embodiment, activating the bonding material comprises applying heat and pressure to the at least one contact sheet, such as laminating the at least one contact sheet in contact with the solar cells and the front sheet of the photovoltaic module.

In the case of a solar cell and the formation of a photovoltaic module, activating the bonding material is such that the at least one structured conductive element is electrically coupled to the at least one electrically conductive region and conduction of the electrical current generated by the at least one solar cell is enabled.

Specific embodiments of the method 900 will now be described in more detail in relation to the formation of a photovoltaic module with reference to FIGS. 10 and 11.

Figure 10:
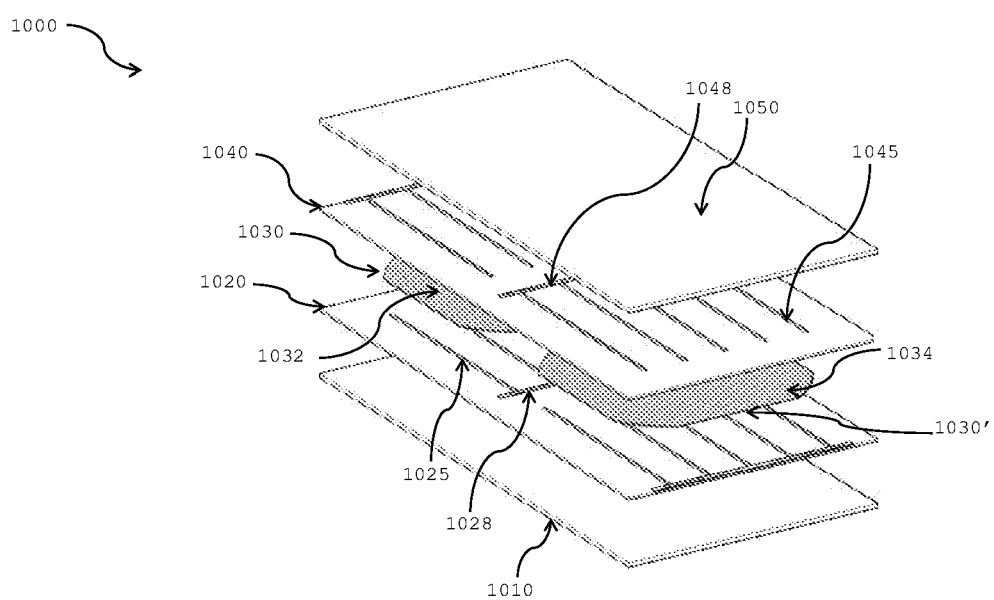
FIG. 10 is a schematic diagram depicting in a perspective exploded view the elements comprising a photovoltaic module formed in accordance with an embodiment of the present invention using the method of FIG. 9.

FIG. 10 shows a schematic diagram depicting in a perspective exploded view elements comprising a photovoltaic module 1000 formed in accordance with embodiments of the method 900. Two adjacent solar cells 1030, 1030' are provided, each of the solar cells 1030, 1030' having a front surface and a rear surface coated with a surface dielectric layer that acts as an antireflection coating (ARC) layer. On each of the front and rear surfaces of the solar cells 1030 and 1030' there is an electrically-conductive electrode which comprises an array of linear electrically-conductive fingers 1032 and 1034, respectively.

The conductive electrode on the solar cells 1030 and 1030' can be formed by the screen-printing of metal pastes such as silver over the surface dielectric layers of the solar cells 1030, 1030'. The solar cells are then typically 'fired' by being passed through a high temperature belt furnace where they experience temperatures in the range of 700° C. to 850° C. for several seconds. This process causes the screen-printed metal electrode comprising metal fingers 1032, 1034 to penetrate through the dielectric layer and make intimate contact with the underlying solar cell.

Alternatively, the electrically-conductive electrode comprising fingers 1032, 1034 can be formed on the solar cells 1030, 1030' by first ablating the dielectric layer using a laser to form thin linear openings, and then depositing a metal stack onto the exposed regions of the solar cells 1030, 1030', the metal stack preferably comprising layers of nickel, copper and a capping layer of silver or tin. The deposition of the metal stack can be achieved by electro-less plating, by using the light-induced current of the respective solar cells 1030, 1030', or by providing an external bias voltage or current to the other surface of the cell such that any semiconducting junctions in the solar cell are forward-biased. The silver capping layers in an embodiment of the present invention should have a thickness of at least 80 nm, and preferably thicker than 100 nm, to provide a sufficient coating for the underlying copper.

When using tin as a capping layer, it is preferable that the thickness of the layer thickness be greater than 1 μm, and more preferably greater than 2 μm. The capping layers can be applied using the plating processes described above for the nickel and copper. Alternatively, thinner capping layers can be formed by immersion or displacement plating where a surface layer of copper is electrochemically displaced with a thin layer of the capping metal.

The solar cells 1030, 1030' are, in the present embodiment as illustrated in FIG. 10, bifacial solar cells 1030, 1030' to form a bifacial photovoltaic module 1000. Bifacial modules can provide a number of benefits due to their ability to convert light from both surfaces of the solar cell into electricity. For example, they provide advantages in highly reflecting environments as light that is incident on the ground or background can be reflected into the modules via their rear surface resulting in an energy conversion efficiency which is enhanced by an albedo factor which can be as large as 30% for highly reflecting surfaces.

However, it will be understood that embodiments of the present invention are not limited to bifacial solar cells and bifacial photovoltaic modules and are also applicable to mono-facial solar cells.

Further, it will be understood that although the present embodiment is described in relation to a photovoltaic module comprising two solar cells, the photovoltaic module formed in accordance with the method 900 may comprise an array of adjacent individual solar cells.

Two contact sheets 1020 and 1040 are further provided to form a bifacial photovoltaic module for which current is extracted from both surfaces of the solar cells 1030 and 1030'. Each of the contact sheets 1020, 1040 comprises a polymeric material and a plurality of structured electrically conductive elements or connectors 1025, 1045. The structured connectors 1025, 1045 are embedded in the polymeric material in a manner such that a surface portion of each of the connectors 1025, 1045 is exposed.

It will be understood that the method 900 of forming a device structure may also be performed using known connectors, such as connectors having a circular round-sectional shape (wires) or ribbons having a rectangular cross-sectional shape or the LSR and LDR.

As mentioned earlier, preferably, the structured connectors comprise one or more metallic elements. Alternative materials (e.g., conductive polymers) can however also be used. The connectors 1025 and connectors 1045 are equally spaced on the respective contact sheets 1020, 1040 to form respective connector patterns on at least one surface of the respective contact sheets 1020, 1040.

A bonding material is then applied to the exposed surface portion of the structured connectors 1025, as well as onto the exposed surface portion of the structured connectors 1045. Alternatively, or simultaneously, the bonding material may be applied onto the electrically-conductive fingers 1032 of the front and/or rear surfaces of the solar cells 1030, and/or onto the electrically conductive fingers 1034 of the front and/or rear surface of the solar cell 1030'.

To form the photovoltaic module 1000 in accordance with the method 900, the solar cells 1030, 1030' are positioned between the contact sheets 1020, 1040 such that the contact sheet 1040, which will be referred to in the following as front contact sheet 1040, faces the front surfaces of the solar cells 1030, 1030' and the contact sheet 1020, which will be referred to in the following as rear contact sheet 1020, faces the rear surfaces of the solar cells 1030, 1030'. More specifically, the exposed surface portion of the structured connectors 1045 faces the front surfaces of the solar cells 1030, 1030', and the exposed surface portion of the structured connectors 1025 faces the rear surfaces of the solar cells 1030, 1030'. In the present specific embodiment, when the solar cells 1030, 1030' are positioned between the rear and front contact sheets 1020, 1040, the structured connectors 1025, 1045 are respectively oriented perpendicular to the linear electrically-conductive fingers 1032, 1034 of the adjacent solar cells. Depending on the different conductivities of the electron and hole collecting layers of the solar cells 1030, 1030', the spacing of the linear conductive fingers 1032, 1034 can differ on the front and rear surfaces of the solar cells. However, the spacing and thickness of the linear fingers 1032 and 1034 on the solar cells 1030, 1030' can be tuned to limit power losses due to series resistance. This optimization process depends on the conductivity of the underlying solar cell contact layer, the resistivity of the material used (e.g., metal) for the electrically conductive fingers 1032 and 1034, the cross-sectional area of the fingers, and the distance that the collected current must travel in the fingers before it is collected in the connectors 1025, 1045 of the contact sheets 1020, 1040. In the present specific embodiment, the photovoltaic module 1000 is arranged such that the distance that current must flow along the conductive fingers 1032, 1034 before being transferred into the respective structured connectors 1025, 1045 is equal to half the spacing between the structured connectors 1025, 1045.

Further, the front and rear contact sheets 1040, 1020 are positioned relative to the solar cells 1030, 1030' such that the applied bonding material is located between the electrically-conductive fingers 1032 and respective exposed surface portions of the structured connectors 1025, 1045, and between the electrically-conductive fingers 1034 and respective exposed surface portions of structured connectors 1025, 1045. The bonding material is then activated by heating the polymeric material of contact sheets 1020, 1040 with applied pressure, whereby a bond is formed between the patterns of connectors 1025, 1045 and the respective electrically-conductive fingers 1032, 1034 of solar cells 1030, 1030'. In accordance with an embodiment of the present invention, the bond is such that each of the structured connectors 1025, 1045 is respectively electrically coupled to at least one of the electrically-conductive fingers 1032, 1034.

As illustrated in FIG. 10, the front contact sheet 1040 further comprises an interconnection tab 1028 that is also embedded in the polymeric material in a manner such that at least a surface portion of the interconnection tab 1028 is exposed. Each structured connector 1025 of the connector pattern is electrically-coupled to the interconnection tab 1028. Similarly, the rear contact sheet 1020 comprises a similar interconnection tab 1048 that is also embedded in the polymeric material in a manner such that at least a surface portion of the interconnection tab 1048 is exposed. Each structured connector 1045 of the metal pattern is coupled to the interconnection tab 1048. During fabrication of the photovoltaic module 1000, the bonding material is also applied onto the interconnection tab 1048 and/or interconnection tab 1028 and the front and rear contact sheets 1040, 1020 are positioned relative to the solar cells 1030, 1030' such that the interconnection tabs 1028, 1048 are preferably aligned relative to each other and the applied bonding material is located between the interconnection tabs 1028, 1048. When the bonding material is activated by heating the polymeric material of contact sheets 1020, 1040, and applying pressure, a bond is formed between the interconnection tabs 1028, 1048, whereby the connectors 1025 are connected to connectors 1045 and the conductive fingers 1032 of the rear surface of solar cell 1030 are connected to the conductive fingers 1034 of the front surface of solar cell 1030' such that the solar cells 1030, 1030' are series-connected and conduction of electrical current generated by the solar cells 1030, 1030' is allowed between the solar cells 1030, 1030'.

Although the interconnection elements 1028, 1048 are illustrated as being continuous linear tabs, it will be understood that the interconnection elements 1028, 1048 may alternatively comprise an array of tabs or elements.

In an alternative arrangement, the interconnection tabs 1028 and 1048 are not embedded into the polymer sheets 1020 and 1040, but instead a separate interconnection tab is accurately placed over the ends of the connectors 1025 of sheet 1020 and during the activation process the interconnection tab bonds to both the ends of the connectors 1025 of polymer sheet 1020 and the start of the connectors 1045 of polymer sheet 1040.

In another alternative embodiment, the structured connectors 1025 and structured connectors 1045 may be arranged such that, when the contact sheets 1020, 1040 are positioned relative to the adjacent solar cells 1030, 1030', the structured connectors 1025 and 1045 overlap. In this embodiment, the bonding material is applied to at least portions of the structured connectors 1025 facing portions of the structured connectors 1045, and/or to portions of the structured connectors 1045 facing portions of the structured connectors 1025 such that, when the bonding material is activated, a bond is formed between the overlapping structured connectors 1025 and 1045.

In the example described in FIG. 10, cover sheets 1010 and 1050, which may comprise a glass or polymeric material, are additionally positioned to cover the contact sheets 1020, 1040, respectively, and the whole photovoltaic module assembly is then laminated at a lamination temperature of between 130° C. and 170° C., more preferably at 150° C. for 8 to 15 minutes. The lamination pressure is between 400-900 mbar, more preferably between 500-700 mbar. During this lamination step the bonding material is activated, wherein a bond is formed between the connectors 1025, 1045 and the respective electrically-conductive fingers 1032, 1034 of solar cells 1030, 1030', and as the polymeric material softens on heating, the contact sheets 1020, 1040 further encase or encapsulate the solar cells

1030, 1030'. The lamination step may, for example, be performed for approximately 10 minutes for encapsulating the solar cells 1030, 1030' and sealing the photovoltaic module 1000 from moisture ingress during field operation. Thus, the rear and front contact sheets 1020, 1040 encapsulate the solar cells 1030, 1030' in the module 1000 and may be referred to in the following as rear and front encapsulating polymer contact sheets 1020, 1040.

The bonding material may comprise a metal alloy that melts at a temperature less than the lamination temperature (i.e., below 160° C.) or an electrically-conductive adhesive (ECA) paste or tape. For example, the bonding material may comprise $Sn_{58}Bi_{42}$ solder alloy with a melting point of 138° C., Dow Corning PV-5802 silicone based ECA, or EL-9032ECA tape from Adhesive Research.

It will be understood that although the structured connectors 1025, 1045 have been described as being arranged in a pattern and being aligned in a direction perpendicular to the direction of the electrically-conductive fingers 1032, 1034, respectively, any other configuration, arrangement and orientation, which would further allow coupling electrically the structured connectors and respective electrically-conductive fingers, may be envisaged.

Further, it will be understood that although the solar cells 1030, 1030' have been described as comprising a plurality of electrically-conductive fingers 1032, 1034 on their respective front and rear surfaces, the solar cells may alternatively be coated with a conducting oxide, which is preferably substantially transparent and forms a low-resistance electrical contact with the structured connectors 1025 and 1045 of the contact sheets 1020, 1040 during lamination.

Figure 11:
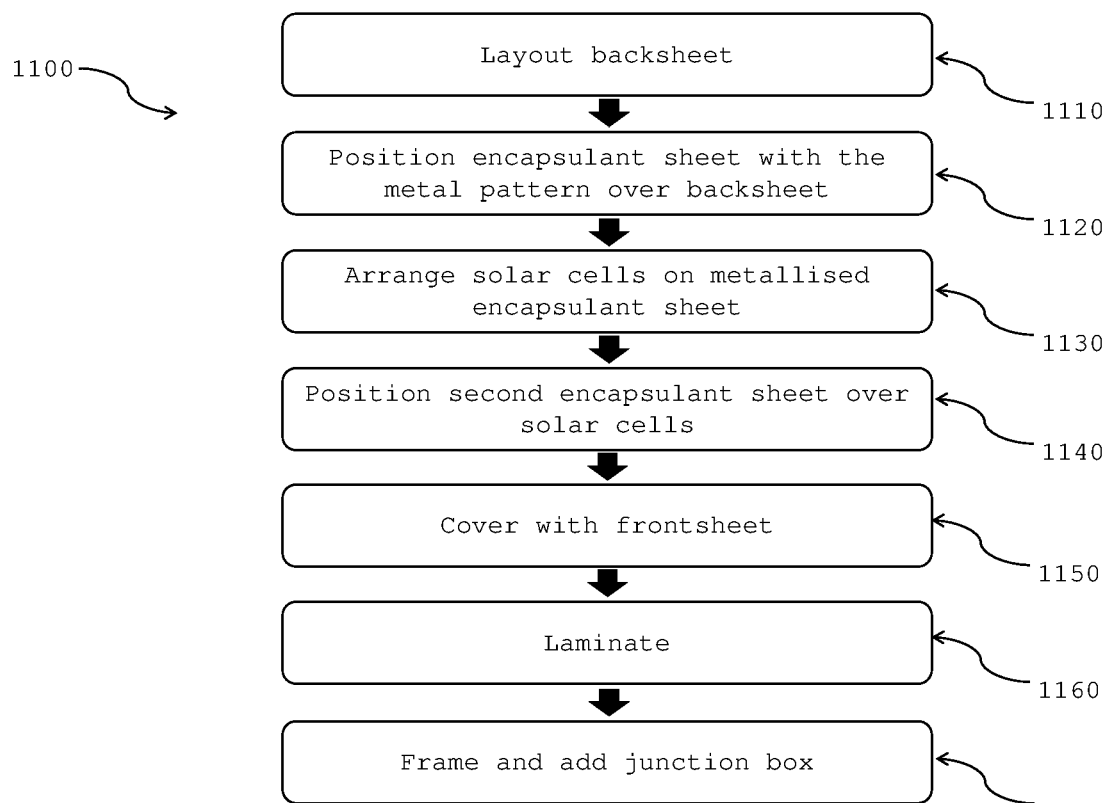
FIG. 11 is a flow chart of a method of forming a photovoltaic module in accordance with an embodiment of the present invention.

With reference to FIG. 11, there is shown a flow chart of a general manufacturing process 1100 to fabricate a photovoltaic module assembly such as photovoltaic module 1000 in accordance with an embodiment of the method 900. In a first step 1110, a back sheet such as cover sheet 1110 is laid out. The back sheet can be a lightweight opaque composite material for mono-facial modules. Alternatively, a glass material or a transparent polymeric material can be used for bifacial modules. Preferably a 'solar glass', which has antireflective and light scattering capability integrated, is used.

An encapsulating polymeric contact sheet such as contact sheet 1020, comprising a polymeric material and electrically-conductive connectors 1025 embedded therein and coated with bonding material as described for method 900 (FIG. 9), is then positioned over the back sheet at step 1120. For example, the contact sheet can be extended over the back sheet from a roll and then, once aligned over the back sheet, cut to size, or the contact sheet can simply be laid as a pre-cut sheet. An optical alignment system is used to align the surface of the polymeric contact sheet with the back sheet using alignment marks provided on the layout assembly surface, the exposed surface portion of the conductive metal pattern facing upwards in readiness for bonding with the solar cells of the photovoltaic module.

At step 1130, solar cells, such as solar cells 1030, 1030', are arranged in a layout pattern on the encapsulating polymeric contact sheet using "pick and place" automation. Preferably the layout placement accuracy is 10 µm±3 µm, and more preferably 10 µm±1 µm, however the placement accuracy can be sacrificed for faster placement if higher processing throughput is required.

Once all the solar cells are laid out, a second encapsulating polymer contact sheet, such as contact sheet 1040, is positioned over the solar cells at step 1140. The second encapsulating polymer contact sheet also contains electrically conductive connectors embedded in the polymeric material and coated with bonding material, if electrical contact is required to both front and rear surfaces of the solar cells, as for bifacial solar cells. A front sheet is then laid out over the second contact sheet at step 1150. The front sheet can comprise glass or a transparent polymeric material that is substantially transparent.

The whole assembly is then moved into a laminator where it is laminated at step 1160. The lamination process can be customized for the type of encapsulating polymeric material used and the type of bonding material employed for coating the electrically conductive structured connectors of the contact sheets and/or the conductive regions (e.g., metal fingers) of the solar cells. For example, plated and printed metal alloys can require different bonding conditions and so the lamination process must be tuned to these requirements. Additionally, if ECAs are being used, then the lamination process may also need to be adapted for the bonding requirements of the ECA.

After lamination, a frame and module electronic components, which are typically housed within one or more junction boxes, are added to the photovoltaic module assembly at step 1170 to complete the fabrication of the photovoltaic module.

Thus, embodiments of the method 900 to form a photovoltaic module can be performed by a photovoltaic module producer simply by (i) purchasing pre-fabricated polymer contact sheets (i.e. contact sheets comprising the at least one structured electrically conductive element or connector embedded therein) and (ii) performing the photovoltaic module layout process according to method 900 using automated solar cell placement technology.

Further, embodiments of the method 900 for the formation of a photovoltaic module eliminate the need to perform a wire handling process as part of the final product manufacturing line, which further allows simplifying the process for interconnecting solar cells in a photovoltaic module and further allow simplifying the manufacturing process of a photovoltaic module.

Although the process of formation of a bifacial photovoltaic module has been described, it will be understood that the same process can be used to interconnect mono-facial solar cells comprising fully-metallized rear surfaces, provided that the fully-metallized solar cell rear surfaces can bond sufficiently with the bonding material on the polymeric contact sheet. For example, if the rear surfaces of the solar cells comprise screen-printed and 'fired' aluminium, then the surface may need to contain bonding regions comprising another metal such as silver or be pre-treated before bonding can be achieved. Options for this pre-treatment include zincating and use of a tin-pad technology, such as the tin-pad technology commercialized by Schmid. Another option made possible by the pattern flexibility and the high conductivity of a rear aluminium electrode is to have a different electrically conductive pattern (e.g., fewer connectors) that bonds to the front and rear surfaces of the solar cell. Since the rear aluminium electrode is very electrically conductive and non-transparent then fewer wider connectors can be used in the polymeric contact sheet, with bonding achieved using an ECA.

It should also be clear from the above description that the interconnection process can also be applied to interdigitated back contact (IBC) cells. For example, it could be used to achieve cell interconnection method for IBC cells metallized as described by Z. Li et al in "Electrical and optical analysis of polymer rear insulation layers for back contact cells" (published in Energy Procedia, 77, 744-751) and U. Romer et al, in "Decoupling the metal layer of back contact solar cells—optical and electrical benefits" (published in Energy Procedia, 77, 744-751).

The structured connectors 1025, 1045 embedded into the polymeric material of the contact sheets 1020, 1040, may have a polygonal cross-sectional shape such as the cross-sectional shapes of connectors 300, 500 or 600, and may be formed specifically to have a non-circular cross-sectional shape that allows achieving desired optical and current-bearing properties, which will be described in more detail with references to FIGS. 18(*b*) to 23.

With reference to FIGS. 12 to 17, methods for embedding connectors into a polymeric material to form a contact sheet will now be described. The connectors may be provided in the form of known connectors such as connectors having a rectangular, round, or triangular cross-sectional shape, as well as in the form of structured connectors such as structured connectors 300, 500, or 600 provided in accordance with embodiments of the present invention.

Figure 12:
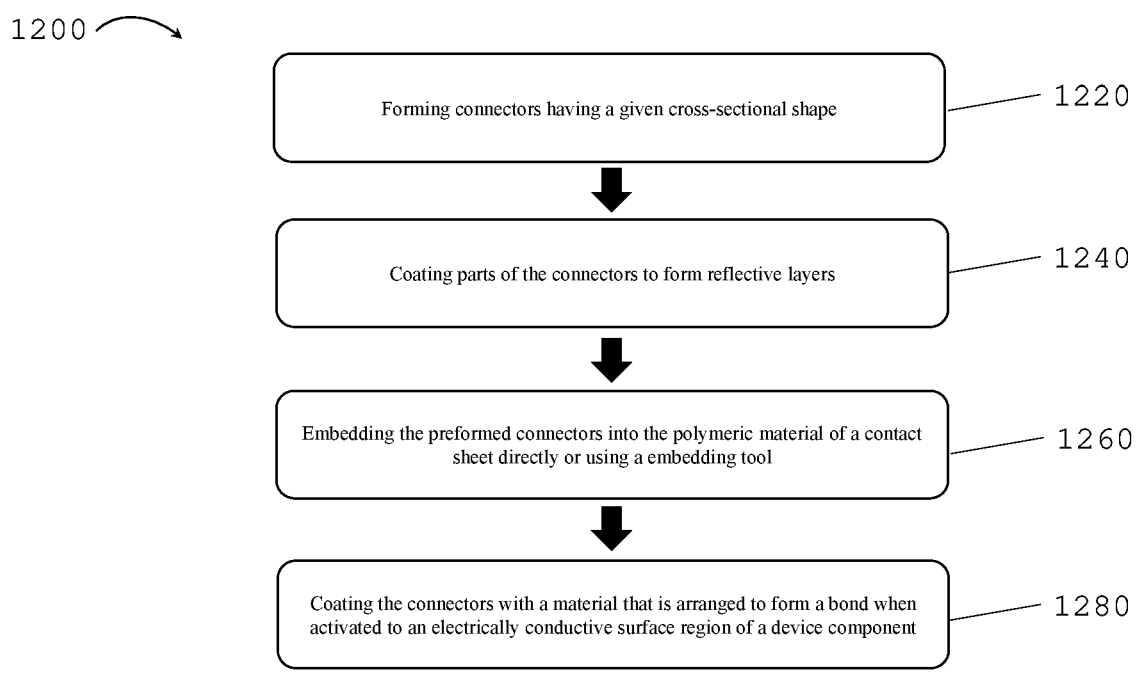
FIG. 12 is a flow chart of a method used for embedding a structured connector into a polymeric material of a contact sheet of a device structure in accordance with an embodiment of the present invention.

One embedding method 1200 in accordance with an embodiment of the present invention is illustrated in the flow chart of FIG. 12. In step 1220, connectors or metal wires are formed with a given cross-sectional shape by extruding or drawing the wires through a series of dies having a required size and shape, and then annealing the obtained wires to make them soft.

Portions of the surfaces of the connectors or metal wires are preferably coated (at step 1240) to form reflective surfaces that can improve the light re-direction in the photovoltaic module. Possible coating methods are described with respect to FIGS. 8(*a*)-(*d*). Trenches or recess portions to assist the embedding of the metal wires are then optionally formed in the polymeric material and aligned with the desired locations for the connectors. The connectors are then placed into the respective trenches or recess portions in step 1260 to form a contact sheet, whereby the connectors are embedded into the polymeric material and respective surface portions of the connectors are exposed. The trenches can be formed by laser ablation or using a heated imprinter that locally melts and deforms the polymer. It will be appreciated that the contact sheets 1020, 1040 may alternatively be provided with trenches or recess portions already formed into the polymeric material, the trenches or recess portions being arranged to receive the connectors or structured wires.

Alternatively, the connectors can be placed over the polymeric material and embedded directly at step 1260 by laminating the assembly of connectors and polymeric material at a temperature between 75 and 85° C., and more preferably at 80° C. for between 5 and 15 min and more preferably 10 min. Although the placement accuracy of the connectors may be limited with this method due to a possible movement of the connectors between layout and lamination, this low-cost embedding method can be suitable when a small number of connectors is required, and/or lower alignment precision is necessary.

Improved control over the alignment and orientation of the connectors in the polymeric material can be achieved by placing and holding the connectors in a thermally conductive embedding tool through vacuum suction. The connectors are then embedded in the polymeric material by application of localized heat. This process is described in more detail below with further reference to different cross-sectional geometries of connectors in FIGS. 13 to 18.

Finally, in step 1280 the exposed surface portions of the embedded connectors are coated with a bonding material in preparation for photovoltaic module fabrication. The bonding material is preferably a solder and is applied with localized heating, the heating also melting the polymeric material in the vicinity of the connector and acting to flow the polymer around the connector, whereby, upon cooling, the connector is embedded in the polymeric material and a contact sheet is formed.

Figure 13:
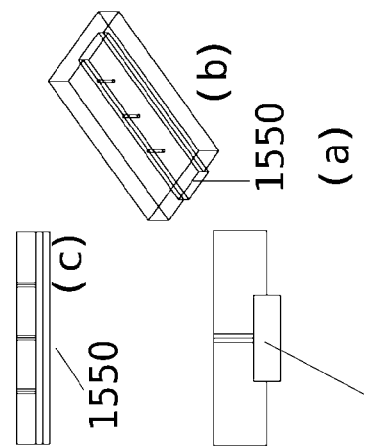
FIGS. 13(a)-(c) to 15(a)-(c) are schematic perspective and cross-sectional representations of known connectors and of a device used for embedding the respective connectors in a polymeric material of a contact sheet in accordance with an embodiment of the present invention.
Figure 14:
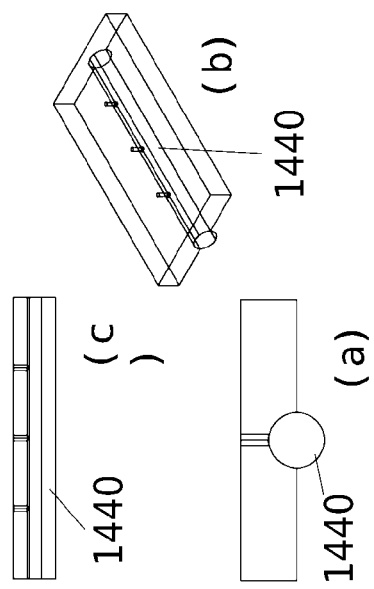
Figure 15:
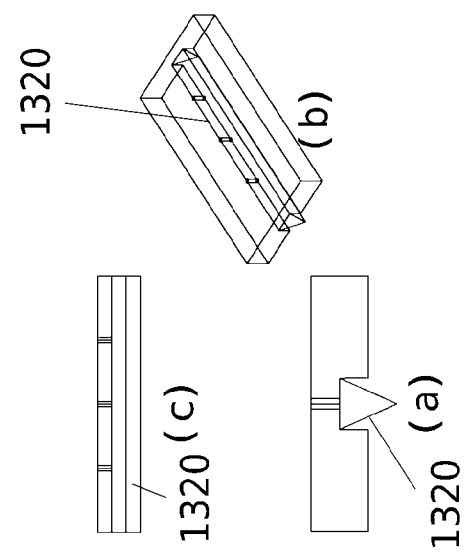
Figure 16:
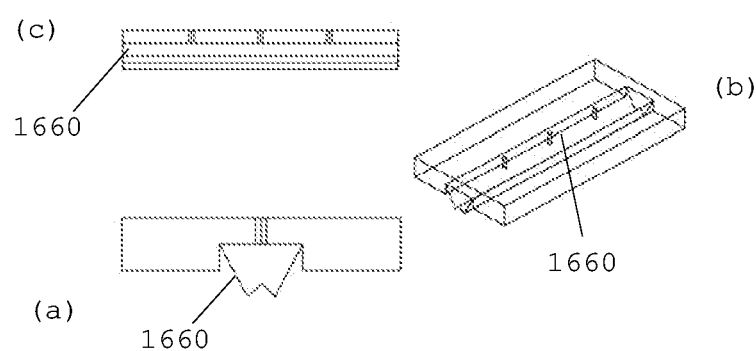
FIGS. 16(a)-(c) are schematic perspective and cross-sectional representations of a structured connector and of a device used for embedding the structured connector in a polymeric material of a contact sheet in accordance with an embodiment of the present invention.

FIGS. 13 to 15 depict a single connector embedding tool for a number of known connector cross-sectional shapes or geometries. FIGS. 16(*a*)-(*c*) depict a single connector embedding tool for a structured connector having a cross-sectional shape or geometry in accordance with a specific embodiment of the present invention, with reference to the embodiment described in FIG. 3. For each of FIGS. 13 to 16, Figure (a) shows a cross-section of the connector held in the embedding tool and aligned to a vacuum line; Figure (b) shows a 3D perspective section of the embedding tool holding a connector; and Figure (c) shows a cross sectional view of the connector and embedding tool in a plane perpendicular to a longitudinal direction of the connector and embedding tool.

Specifically, in FIGS. 13, 14 and 15, connectors 1320, 1440 and 1550 indicate known connectors with a triangular, circular and rectangular cross-sectional shape, respectively. The limitations of these cross-sectional geometries have been previously described.

Figure 3:
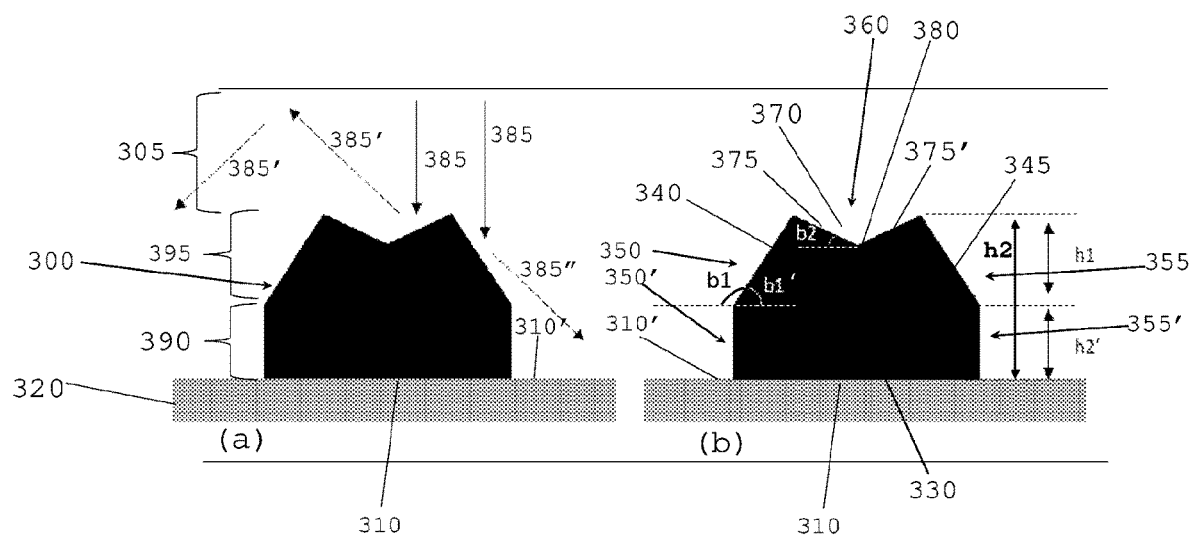
FIGS. 3(a)-(b) are schematic diagrams depicting a cross-sectional view of a structured connector provided in accordance with an embodiment of the present invention.

FIGS. 16(*a*)-(*c*) show a connector 1660 having a mountain-ridge like cross-sectional shape partially similar to the structure of connector 300 illustrated in FIG. 3. This mountain-ridge like structure provides light diverting and light scattering surfaces as described above with reference to FIGS. 3 to 6, and, as discussed above, advantageously allows reducing the stress that is applied to a respective solar cell and further enables light to be reflected more efficiently onto the respective solar cell. In addition, the greater height of the mountain-like structure described in reference to connector 300 and connector 1660 (in comparison to the LDR) further allows reducing stress applied to the polymeric material, which may contribute to a substantially improved overall performance of the photovoltaic module.

As illustrated in FIGS. 13 to 16, the embedding tool has a trench or recess portion that is arranged to hold a flat bottom surface of the connector and ensure that the connector is aligned having top and side surface portions, which are to be embedded in the polymeric material and are designed for efficient light capture in the photovoltaic module, oriented correctly relative to the polymeric material.

Figure 17:
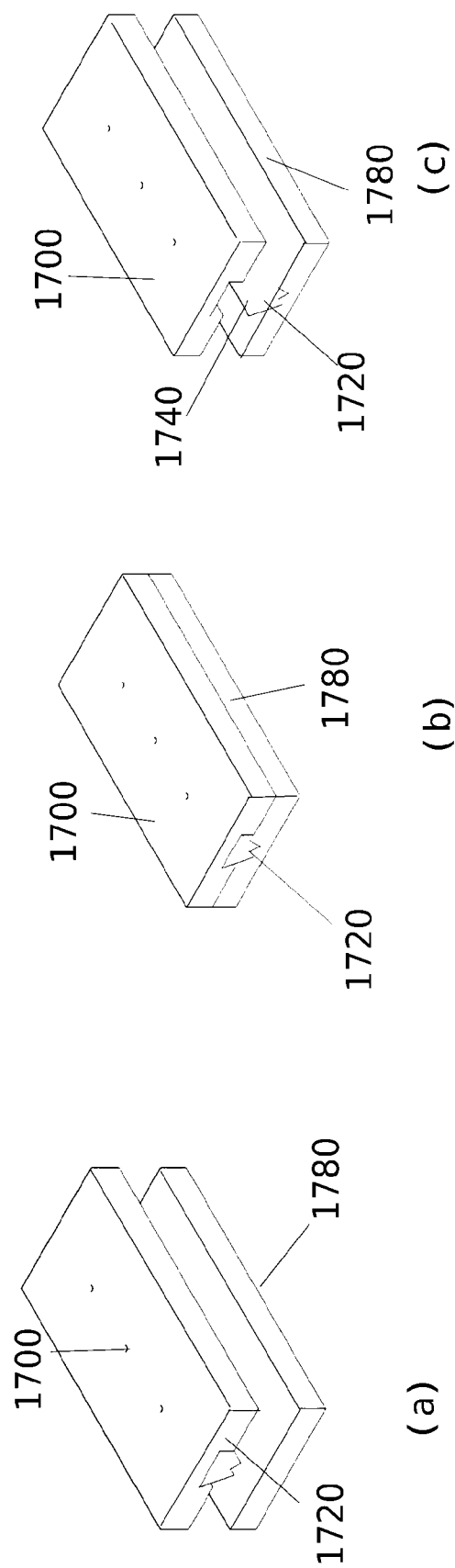
FIGS. 17(a)-(c) are schematic diagrams illustrating a device and a method for embedding a structured connector in a polymeric material of a contact sheet in accordance with an embodiment of the present invention.

FIGS. 17(*a*)-(*c*) then illustrate the specific embodiment of method 900 wherein a metallized polymeric contact sheet, also referred to in the present description as 'encapsulant' or 'metallized encapsulant', is formed by embedding a piece of structured connector into the polymeric material using an embedding tool 1700.

The embedding tool 1700 is adapted to receive and hold the connector 1720 having a mountain-ridge structure (similar to connector 1660). The connector 1720 is placed in the embedding tool 1700 and held in position by vacuum suction such that the mountain-ridge surface structure is exposed. The embedding tool 1700 with the connector 1720 are then heat-pressed onto the polymeric material 1780, wherein the polymeric material 1780 flows around and adheres to the exposed surface structure of the structured connector 1720. The vacuum holding the connector 1720 in the embedding tool 1700 is then released and the tool 1700 is separated from the connector 1720 as illustrated in FIG. 17(*c*), whereby, upon cooling of the polymeric material 1780, the structured connector 1720 is embedded into the polymeric material 1780, a surface portion 1740 of the connector 1720 is exposed, and a contact sheet is formed.

Figure 18:
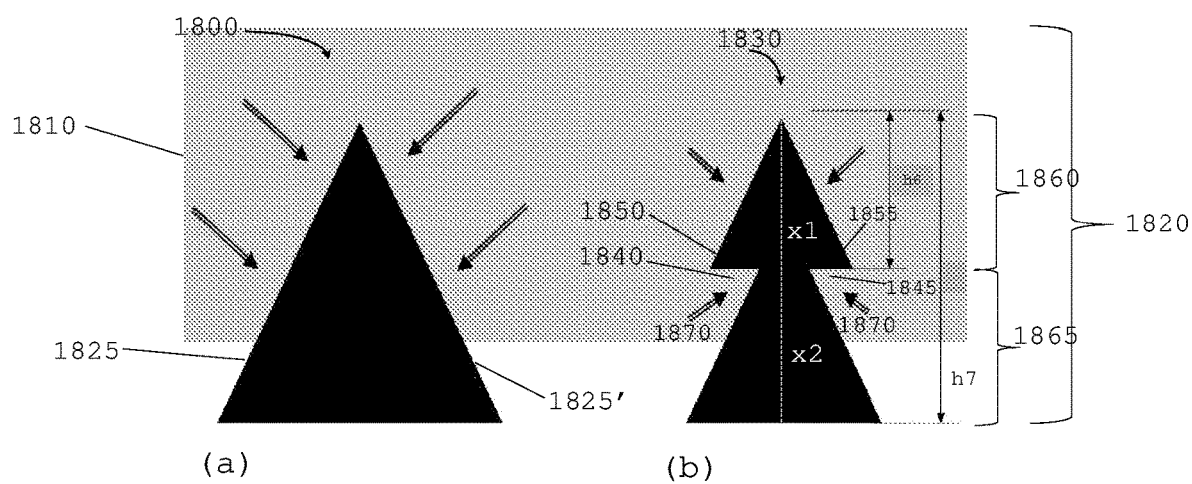
FIG. 18(a) is a schematic diagram depicting a cross-sectional front view of a known connector.
FIG. 18(b) is a schematic diagram depicting a cross-sectional front view of a structured connector provided in accordance with a further embodiment of the present invention.

FIG. 18(*a*) shows a cross-sectional front view of a known LDR connector 1800 having a triangular cross-sectional shape and being embedded in a polymeric material 1810 to form a contact sheet 1820 as described above. Arrows represent forces that are applied onto the opposite side portions 1825, 1825' of the connector 1800 when the connector 1800 is embedded in, and partially surrounded by, the polymeric material 1810. The polymeric material 1810 applies pressure onto the side portions 1825, 1825' such that the LDR connector 1800 is "pushed out" of the polymeric material 1810, which affects the process of securing the connector 1800 within the polymeric material 1810.

A further embodiment of the present invention provides a structured connector having a structure that allows facilitating securing the connector within the polymeric material 1810 when forming the contact sheet 1820. Specifically, a structured connector is provided that has a non-circular cross-sectional shape and comprises at least one projection and/or at least one recess, the at least one projection and/or at least one recess having an anchoring function when connector is embedded in the polymeric material. The non-circular cross-sectional shape of the connector may be a polygonal cross-sectional shape. However, it will be understood that embodiments of the present invention are not limited to structured electrically conductive elements or connectors having a polygonal cross-section shape and that any shape that is not circular, including non-polygonal and polygonal cross-sectionally shaped electrically conductive elements or connectors, are considered to be within the scope of the present invention.

The at least one projection and/or the at least one recess are arranged such that, when the connector is embedded in the polymeric material, the polymeric material at least partially surrounds the at least one projection and/or at least partially fills the at least one recess. The presence of the at least one projection and/or at least one recess allows facilitating securing the respective connector within the polymeric material of the contact sheet.

FIG. 18(*b*) shows a cross-sectional front view of a structured connector 1830 embedded in the polymeric material 1810 to form contact sheet 1820 as described above. Arrows represent forces that are applied onto the opposite side portions of the structured connector 1830 when the structured connector 1830 is embedded in, and partially surrounded by, the polymeric material 1810. The structured connector 1830 for positioning on, and electrically coupling to, a surface of a solar cell (not shown), has initially a triangular cross-sectional shape similar to the cross-sectional shape of connector 1800, and has recesses 1840, 1845 in the opposite side portions 1825, 1825' defining projections 1850, 1855 at the opposite side portions 1825, 1825'. Thus, the structured connector 1830 is arranged such that, when the structured connector 1830 is embedded in the polymeric material 1810 of the polymeric contact sheet 1820, the polymeric material 1810 at least partially fills the recesses or spaces 1840, 1845 between projections 1850, 1855 and the recesses 1840, 1845 and/or projections 1850, 1855 have an anchoring function as illustrated by the direction of arrows 1870, which facilitates securing the connector 1830 within the polymeric material of the polymeric contact sheet. The top part of the structured connector 1830 comprising the projections 1850, 1855 has a height h6 and the structured connector 1830 has an overall height h7, which heights h6 and h7 can be varied for achieving a given embedding of the structured connector 2030 into the polymeric material 2010.

More specifically, the structured connector 2030 has a cross-sectional shape that corresponds to an outline of two overlapping triangular portions 2060, 2065, each triangular portion having an axis x1, x2 and being oriented such that the axis x1 of the triangular portion 2060 coincides with the axis x2 of the other triangular portion 2065.

Figure 19:
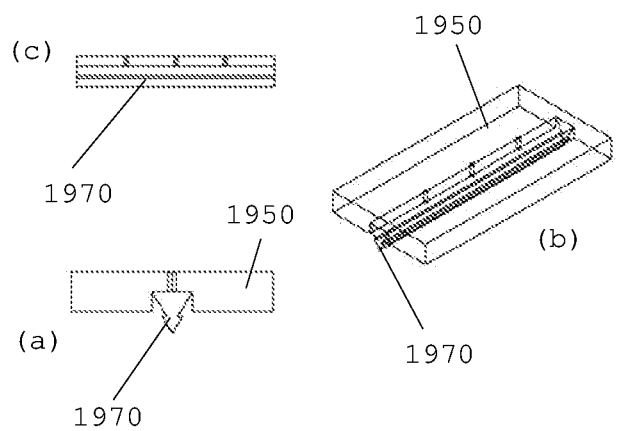
FIGS. 19(a)-(c) are schematic perspective and cross-sectional representations of a structured connector provided in accordance with the embodiment of FIG. 18(b) and of a device used for embedding the structured connector in a polymeric material of a contact sheet in accordance with an embodiment of the present invention.

FIGS. 19(*a*)-(*c*) to 21(*a*)-(*c*) depict a single connector embedding tool for a structured connector having a non-circular cross-sectional shape and provided with recesses and/or projections having an anchoring function for facilitating adhesion of the structured connector to the polymeric material when the structured connector is embedded in the polymeric material, such as was described in relation to connector 1830 with reference to FIG. 18(*b*). Similarly to FIGS. 13 to 16, FIGS. 19(*a*), 20(*a*) and 21(*a*) each show a cross-section of the connector held in the embedding tool and aligned to a vacuum line; FIGS. 19(*b*), 20(*b*), and 21(*b*) show a 3D perspective section of the embedding tool holding the connector; and FIGS. 19(*c*), 20(*c*) and 21(*c*) show a cross sectional view of the connector and embedding tool in a plane perpendicular to a longitudinal direction of the connector and embedding tool. FIGS. 19(*a*)-(*c*) depict in particular a single connector embedding tool 1950 for a structured connector 1970 having a cross-sectional shape/geometry substantially identical to the cross-sectional/geometry of connector 1830 described with reference to FIG. 18(*b*). FIGS. 20 to 21 depict further connectors 2080, 2190 held into a trench of a connector embedding tool, such as embedding tool 1950, the connectors 2080, 2190 having respective non-circular cross sectional shapes with recesses and/or projections in side, top and/or bottom surface portions to provide anchoring points when the respective connectors 2080, 2190 are embedded into a polymeric material of a contact sheet (not shown), and facilitate securing the respective structured connectors within the polymeric material of the contact sheet for forming a device structure such as, for example, a photovoltaic module. As described above with reference to FIG. 18(*b*), when the respective connector 2080, 2190 is embedded in the polymeric material, the polymeric material will at least partially fill recesses or spaces between the projections and at least partially surround the projections, which will facilitate securing the structured connector 2080, 2190 within the polymeric material of the contact sheet.

In the context of solar cells and the formation of a photovoltaic module, like existing connector-based interconnection processes, embodiments of the present invention do not require busbar regions to be formed on the solar cell front and rear surfaces, thereby enabling higher cell voltages to be achieved. However, embodiments of the present invention provide the additional benefits that the material cost for the formation of a device structure, such as a photovoltaic module, can be substantially reduced. Further, the embedding method 1200, for example, using an embedding tool, provides a greater flexibility in terms of connector cross-sectional shapes, wherein enhanced light trapping can be achieved through the incorporation of light structuring features and reflective coatings. Additionally, use of specifically designed connector geometries such as the mountain-ridge structure or structures providing anchoring portions as described with reference to FIGS. 18(*b*) to 21, can also decrease the stress that can evolve in the underlying solar cells interconnected in a photovoltaic module compared to when using connectors having, for example, a circular cross-sectional shape (as employed for example in the multiBB technique discussed above).

The polymeric material used for application to embodiments of the present invention may preferably comprise highly water-resistant materials such as POE, thermoplastic polyolefins (TPO), silicones (such as Dow Corning Sylgard 184), ionomer-based encapsulants, such as DuPont's PV5400 and PV8400, or ethylene vinyl acetate (EVA).

Further, it is to be noted that the contact sheets comprising the polymeric material and the structured connectors or electrically conductive elements embedded therein may be used for other applications, besides encapsulation of solar cells, and may for example be used for forming an electrical or electronic circuit or sensor or antennae elements.

Figure 22:
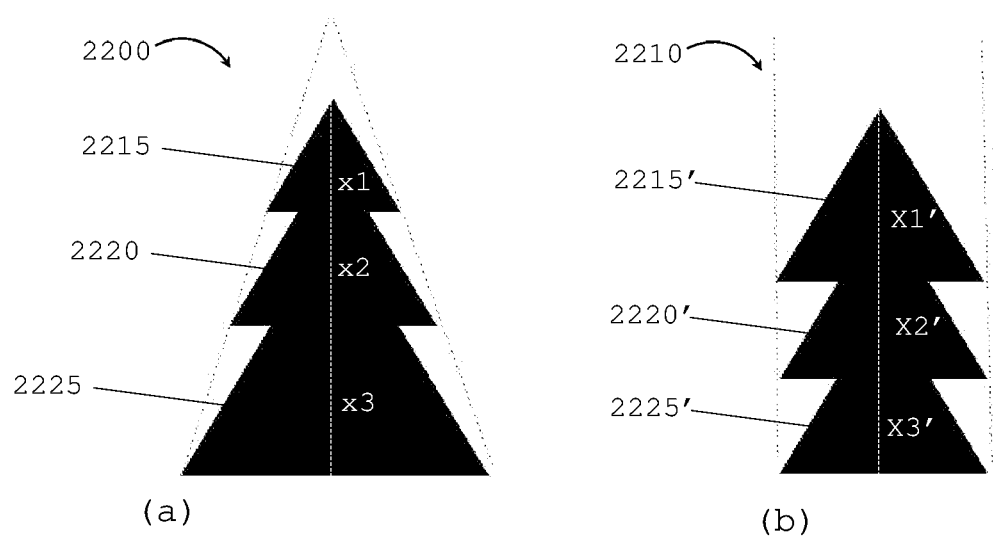
FIGS. 22(a)-(b) are schematic diagrams of cross-sectional front views of structured connectors provided in accordance with again a further embodiment of the present invention.

The inventors have further discovered that a structured connector comprising additional recesses and/or projections (as compared to the structured connectors 1830 and 2080) having an anchoring function when embedded in the polymeric material, may further allow (i) improving the reliability of an embedment between the structured connector and the polymeric material, such as polymeric material 1810, as well as (ii) providing an improved adhesion of the structured connector to the polymeric material 1810. FIGS. 22(a) and 22(b) show cross-sectional front views of structured connectors 2200 and 2210, respectively, provided in accordance with a further embodiment of the present invention. Each of the connectors 2200 and 2210 has a cross-sectional shape that corresponds to an outline of three overlapping triangular portions 2215, 2220, 2225 and 2215', 2220', 2225', respectively. Each triangular portion has an axis x1, x2, x3 and x1', x2', x3', respectively, and is oriented such that: (i) the axis x1 of triangular portion 2215 coincides with the respective axes x2 and x3 of triangular portions 2220 and 2225, and (ii) the axis x1' of triangular portion 2215' coincides with the respective axes x2' and x3' of triangular portions 2220' and 2225'.

The inventors have also discovered that formation of the contact sheet with one or more connectors embedded therein can further be facilitated by providing a structured connector that comprises at least one recess and/or projection having an anchoring function in each of the opposite side portions and the bottom portion, the or each recess and/or projection in the bottom portion being substantially identical to the or each recess and/or projection in each of the opposite side portions and the bottom portion.

Figure 23:
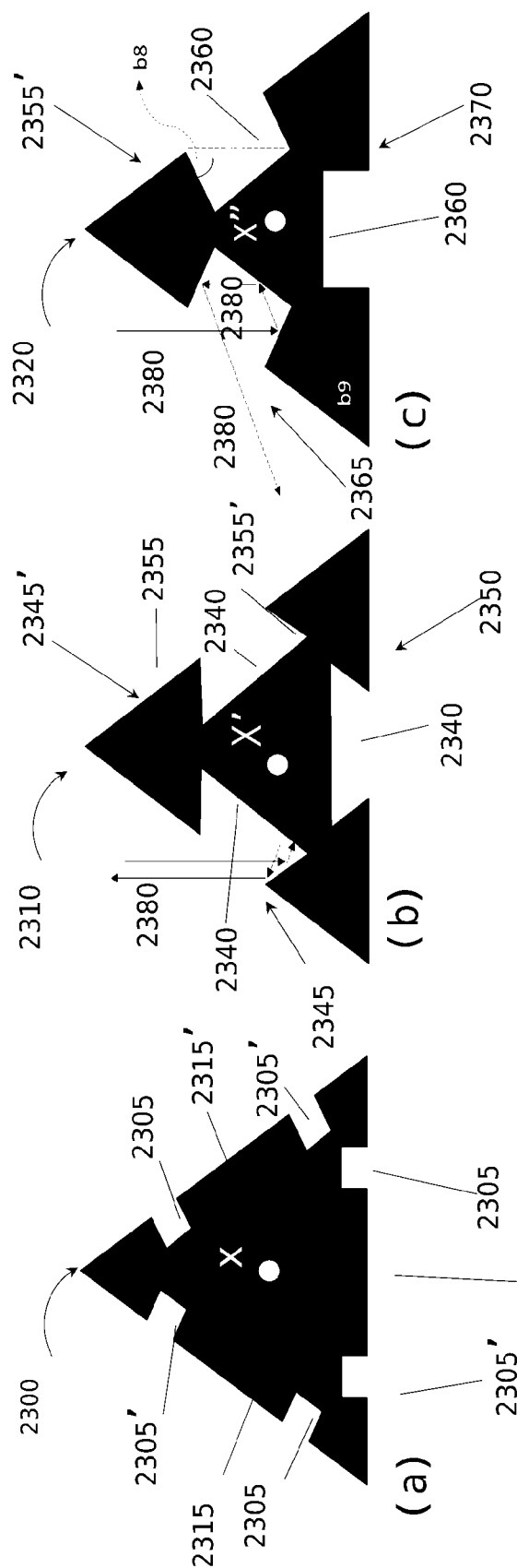
FIGS. 23(a)-(c) are schematic diagrams that depict cross-sectional front views of structured connectors provided in accordance with a further embodiment of the present invention.

FIGS. 23(a)-(c) show cross-sectional front views of structured connectors 2300, 2310, and 2320. Structured connector 2300 comprises two substantially identical recesses 2305, 2305' in each of the opposite side portions 2315, 2315' and the bottom portion 2325. The substantially identical recesses 2305, 2305' are slots having side walls 2330, 2335 parallel to each other. The structured connector 2300 has an axis x and the recesses 2305, 2305' in the opposite side portions 2315, 2315' and the bottom portion 2325 are arranged such that a shape of the structured connector 2300 in a cross-section plane perpendicular to the axis x has a three-fold rotational symmetry.

The structured connector 2310 comprises one recess 2340 in each of the opposite side portions 2345, 2345' and the bottom portion 2350, the recess 2340 being substantially identical in each of the portions 2345, 2345' and 2350. The recess 2340 represents an 'arbitrary' slot wherein the side walls of the slot are not parallel to each other such that respective projections 2355, 2355' are defined on each of the opposite side portions 2345, 2345' and the bottom portion 2350. In the same manner as for structured connector 2300, the structured connector 2310 has an axis x' and the recess 2340 and projections 2355, 2355' are arranged on the opposite side portions 2315, 2315' and on the bottom portion 2325 such that a shape of the structured connector 2310 in a cross-section plane perpendicular to the axis x' has a three-fold rotational symmetry.

The connector 2320 comprises one recess 2360 in each of the opposite side portions 2365, 2365' and the bottom portion 2370, the recess 2360 being substantially identical in each of the portions 2365, 2365' and 2370. The recess 2360 represents a substantially rectangular slot wherein the side walls of the slot are parallel to each other. In the same manner as for structured connectors 2300 and 2310, the connector 2320 has an axis x" and the recesses 2360 are arranged on the opposite side portions 2365, 2365' and on the bottom portion 2370 such that a shape of the structured connector 2320 in a cross-section plane perpendicular to the axis x" has a three-fold rotational symmetry.

As shown in FIG. 23(b) by light rays 2380, an 'arbitrary' slot such as slot 2340 having non-parallel side walls may cause, in use when the structured connector is positioned on the solar cell, light directed at normal incidence relative to a surface of the solar cell to be trapped in an area surrounding the projections 2355, 2355' or even to be reflected back towards the glass (and/or polymer) sheet within the escaping cone of the glass (and/or polymer) sheet. Slots having parallel side walls however, as seen in FIG. 23(c), allow light directed at normal incidence relative to a surface of the solar cell to be reflected in a direction outside the area surrounding the slot, which would be the same direction as if there were no slots, i.e. in the embodiment of a triangle-shaped connector. Thus, the structured connector 2320 allows an improved embedding and anchoring in the polymeric material to form the contact sheet as well as maintaining an optimal optical and electrical performance. In addition, the angle b8 shown in FIG. 23(c) should be equal or larger than the base angle b9 of the structured connector 2320 so as to provide for a minimum depth-width ratio of the structured connector 2320.

It will be understood that it is also envisaged that the opposite side portions and/or bottom portion of the structured connector may comprise more than two recesses and may have any other shape suitable for achieving a given optical performance.

When embedded in a polymeric material of a contact sheet and coupled to electrical contacts of solar cells for forming a photovoltaic module, the structured connectors herein described in relation to FIGS. 16 to 23, the formed contact sheets and solar cells can then further be encapsulated in glass and/or polymer cover sheets to form the photovoltaic module.

In addition, it is to be noted that the structured connectors herein described in accordance with specific embodiments of the present invention may alternatively not be embedded into a polymeric material of a contact sheet. The solar cells with the structured connectors may then simply be encapsulated in glass and/or polymer cover sheets. For example, the structured connectors may also be used for the manufacture of a photovoltaic module according to various known methods of connecting solar cells within a photovoltaic module, such as the 'solar tabber and stringer' method.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features in various embodiments of the invention.

Modifications and variations as would be apparent to a skilled addressee are determined to be within the scope of the present invention.

It is also to be understood that, if any prior art publication is referred to herein, such reference does not constitute an admission that the publication forms a part of the common general knowledge in the art, in Australia or any other country.

The invention claimed is:

1. A method of forming a device structure, the method comprising:
    providing at least one device component having front and rear device component surfaces and having at least one electrically conductive region on at least one of the front and rear device component surfaces;
    providing at least one contact sheet comprising a polymeric material and at least one electrically conductive element that has a non-circular cross-sectional shape and is embedded in the polymeric material in a manner such that a surface portion of the at least one electrically conductive element is exposed;
    applying a bonding material to either one or both of the exposed surface portion and the at least one electrically conductive region on the at least one of the front and rear device component surfaces;
    positioning the at least one contact sheet relative to the at least one device component such that the bonding material is located between the at least one electrically conductive region and the exposed surface portion, and that the at least one contact sheet is attached to the at least one device component; and
    activating the bonding material such that a bond and an electrically conductive coupling are formed between the at least one electrically conductive region and the exposed surface portion;
    wherein providing the at least one contact sheet comprises:
    providing a sheet comprising the polymeric material, the sheet comprising the polymeric material having at least one recess portion, the at least one recess portion being arranged to receive the at least one electrically conductive element;
    providing the at least one electrically conductive element;
    placing the at least one electrically conductive element into a respective recess portion in the at least one recess portion; and
    applying heat to the polymeric material and subsequently allow cooling of the polymeric material such that the at least one electrically conductive element and the polymeric material adhere to each other and the at least one electrically conductive element is embedded in the polymeric material and the surface portion of the electrically conductive element is exposed.

2. The method of claim 1, wherein the at least one electrically conductive element has a polygonal cross-sectional shape.

3. The method of claim 1, wherein placing the at least one electrically conductive element into the respective recess portion comprises press-fitting the at least one electrically conductive element into the respective recess portion.

4. The method of claim 1, wherein the device structure is a solar module and the at least one device component is a solar cell.

5. The method of claim 1, wherein activating the bonding material comprises applying heat to the at least one contact sheet.

6. A method of forming a device structure, the method comprising:
    providing at least one device component having front and rear device component surfaces and having at least one electrically conductive region on at least one of the front and rear device component surfaces;
    providing at least one contact sheet comprising a polymeric material and at least one electrically conductive element that has a non-circular cross-sectional shape and is embedded in the polymeric material in a manner such that a surface portion of the at least one electrically conductive element is exposed;
    applying a bonding material to either one or both of the exposed surface portion and the at least one electrically conductive region on the at least one of the front and rear device component surfaces;
    positioning the at least one contact sheet relative to the at least one device component such that the bonding material is located between the at least one electrically conductive region and the exposed surface portion; and
    activating the bonding material such that a bond and an electrically conductive coupling are formed between the at least one electrically conductive region and the exposed surface portion,
    wherein the at least one electrically conductive element comprises at least one projection and/or at least one recess, the at least one projection and/or the at least one recess being arranged such that, when the at least one electrically conductive element is embedded in the polymeric material, the polymeric material at least partially surrounds the at least one projection and/or at least partially fills the at least one recess, wherein the at least one projection and/or the at least one recess has an anchoring function, which facilitates securing the at least one electrically conductive element within the polymeric material of the at least one contact sheet.

7. The method of claim 6, wherein the at least one electrically conductive element has a polygonal cross-sectional shape.

8. The method of claim 6, wherein providing the at least one contact sheet comprises:
    providing a sheet comprising the polymeric material;
    providing the at least one electrically conductive element;
    providing a thermally conductive stamping device that is arranged to receive the electrically conductive element;
    heat pressing the electrically conductive element into the sheet using the stamping device such that the polymeric material adheres to the electrically conductive element, whereby the electrically conductive element is embedded in the polymeric material such that the surface portion of the electrically conductive element is exposed; and
    separating the thermally conductive stamping device from the electrically conductive element.

9. The method of claim 6, wherein the at least one device component has the at least one electrically conductive region at each of the front and rear device component surfaces and the method further comprises:
    providing a front contact sheet comprising a polymeric material and at least one electrically conductive element that has a non-circular cross-sectional shape and is embedded in the polymeric material such that a surface portion of the at least one electrically conductive element is exposed;

providing a rear contact sheet comprising a polymeric material and at least one electrically conductive element that has a non-circular cross-sectional shape and is embedded in the polymeric material such that a surface portion of the at least one electrically conductive element is exposed;

positioning the front contact sheet and the rear contact sheet relative to the at least one device component such that the exposed surface portions of the at least one conductive element of each the front and the rear contact sheets face the at least one conductive region on the front and rear device component surfaces, respectively;

applying a bonding material onto (i) either one or both of the exposed surface portion of the at least one electrically conductive element of the front contact sheet and the at least one electrically conductive region of the front device component surface of the at least one device component, and (ii) either one or both of the exposed surface portion of the at least one electrically conductive element of the rear contact sheet and the at least one electrically conductive region of the rear device component surface of the at least one device component;

positioning the front and rear contact sheets relative to the at least one device component such that the bonding material is located between the at least one electrically conductive region of the front device component surface and the exposed surface portion of the front contact sheet and between the at least one electrically conductive region of the rear device component surface and the exposed surface portion of the rear contact sheet; and activating the bonding material such that the bonding material forms electrically conductive couplings, wherein the at least one electrically conductive elements of the front and rear contact sheets are electrically coupled to electrically conductive regions of the front and rear device component surfaces, respectively.

10. The method of claim 9, wherein the at least one device component comprises a first device component having first front and rear device component surfaces and an adjacent second device component having second front and rear device component surfaces, each one of the first and adjacent second device components being positioned between the front contact sheet and the rear contact sheet, wherein the method further comprises arranging the front and rear contact sheets such that the first and adjacent second device components are interconnected by conductive elements of the front and rear contact sheets.

11. The method of claim 10, further comprising forming an electrically conductive bond between the at least one electrically conductive element of the front contact sheet, which is in use electrically coupled to at least one electrically conductive region of the first front device component surface, and the at least one electrically conductive element of the rear contact sheet, which is in use electrically coupled to at least one electrically conductive region of the adjacent second rear device component surface in a manner such that the first device component and the adjacent second device component are electrically interconnected in series.

12. The method of claim 6, wherein the device structure is a solar module and the at least one device component is a solar cell.

13. A method of forming a device structure, the method comprising:

providing at least one device component having front and rear device component surfaces and having at least one electrically conductive region on at least one of the front and rear device component surfaces;

providing at least one contact sheet comprising a polymeric material and at least one electrically conductive element that has a non-circular cross-sectional shape and is embedded in the polymeric material in a manner such that a surface portion of the at least one electrically conductive element is exposed;

applying a bonding material to either one or both of the exposed surface portion and the at least one electrically conductive region on the at least one of the front and rear device component surfaces;

positioning the at least one contact sheet relative to the at least one device component such that the bonding material is located between the at least one electrically conductive region and the exposed surface portion, and that the at least one contact sheet is attached to the at least one device component; and activating the bonding material such that a bond and an electrically conductive coupling are formed between the at least one electrically conductive region and the exposed surface portion;

wherein the at least one device component has the at least one electrically conductive region at each of the front and rear device component surfaces and the method further comprises:

providing a front contact sheet comprising a polymeric material and at least one electrically conductive element that has a non-circular cross-sectional shape and is embedded in the polymeric material such that a surface portion of the at least one electrically conductive element is exposed;

providing a rear contact sheet comprising a polymeric material and at least one electrically conductive element that has a non-circular cross-sectional shape and is embedded in the polymeric material such that a surface portion of the at least one electrically conductive element is exposed;

positioning the front contact sheet and the rear contact sheet relative to the at least one device component such that the exposed surface portions of the at least one conductive element of each the front and the rear contact sheets face the at least one conductive region on the front and rear device component surfaces, respectively;

applying a bonding material onto (i) either one or both of the exposed surface portion of the at least one electrically conductive element of the front contact sheet and the at least one electrically conductive region of the front device component surface of the at least one device component, and (ii) either one or both of the exposed surface portion of the at least one electrically conductive element of the rear contact sheet and the at least one electrically conductive region of the rear device component surface of the at least one device component;

positioning the front and rear contact sheets relative to the at least one device component such that the bonding material is located between the at least one electrically conductive region of the front device component surface and the exposed surface portion of the front contact sheet and between the at least one electrically conductive region of the rear device component surface and the exposed surface portion of the rear contact sheet; and activating the bonding material such that the bonding material forms electrically conductive couplings, wherein the at least one electrically conductive elements of the front and rear contact sheets are electrically coupled to electrically conductive regions of the front and rear device component surfaces, respectively.

14. The method of claim 13, wherein the at least one device component comprises a first device component having first front and rear device component surfaces and an adjacent second device component having second front and rear device component surfaces, each one of the first and adjacent second device components being positioned between the front contact sheet and the rear contact sheet, wherein the method further comprises arranging the front and rear contact sheets such that the first and adjacent second device components are interconnected by conductive elements of the front and rear contact sheets.

15. The method of claim 14, further comprising forming an electrically conductive bond between the at least one electrically conductive element of the front contact sheet, which is in use electrically coupled to at least one electrically conductive region of the first front device component surface, and the at least one electrically conductive element of the rear contact sheet, which is in use electrically coupled to at least one electrically conductive region of the adjacent second rear device component surface in a manner such that the first device component and the adjacent second device component are electrically interconnected in series.

* * * * *